(12) United States Patent
Chiang et al.

(10) Patent No.: US 8,409,354 B2
(45) Date of Patent: Apr. 2, 2013

(54) VAPOR BASED COMBINATORIAL PROCESSING

(75) Inventors: Tony P. Chiang, Campbell, CA (US); Chi-l Lang, Cupertino, CA (US); Sunil Shanker, Santa Clara, CA (US)

(73) Assignee: Intermolecular, Inc., San Jose, CA (US)

( * ) Notice: Subject to any disclaimer, the term of this patent is extended or adjusted under 35 U.S.C. 154(b) by 0 days.

(21) Appl. No.: 13/332,813

(22) Filed: Dec. 21, 2011

(65) Prior Publication Data

US 2012/0090545 A1    Apr. 19, 2012

Related U.S. Application Data

(62) Division of application No. 12/013,729, filed on Jan. 14, 2008.

(51) Int. Cl.
*C23C 16/00* (2006.01)
*C23C 16/458* (2006.01)

(52) U.S. Cl. ........ 118/719; 118/715; 118/729; 118/730; 427/248.1

(58) Field of Classification Search .................. None
See application file for complete search history.

(56) References Cited

U.S. PATENT DOCUMENTS

| 6,015,503 | A * | 1/2000 | Butterbaugh et al. | 216/66 |
| 6,726,776 | B1 * | 4/2004 | Mosely et al. | 118/719 |
| 2004/0052972 | A1 * | 3/2004 | Schmitt | 427/569 |
| 2004/0099213 | A1 * | 5/2004 | Adomaitis et al. | 118/715 |

OTHER PUBLICATIONS

Teeter "Calculations of Optimal Source Geometry and Controlled Combinatorial Gradients in Fixed- and Rotating-Substrate PVD Systems", Nov. 2005.*

* cited by examiner

*Primary Examiner* — Christina Johnson
*Assistant Examiner* — Lisa Herring

(57) ABSTRACT

A combinatorial processing chamber and method are provided. In the method a fluid volume flows over a surface of a substrate with differing portions of the fluid volume having different constituent components to concurrently expose segregated regions of the substrate to a mixture of the constituent components that differ from constituent components to which adjacent regions are exposed. Differently processed segregated regions are generated through the multiple flowings.

13 Claims, 19 Drawing Sheets

VAPOR BASED COMBINATORIAL PROCESSING

PRIORITY CLAIM TO RELATED APPLICATIONS

This application is a Divisional application of U.S. patent application Ser. No. 12/013,729 entitled "Vapor Based Combinatorial Processing" filed on Jan. 14, 2008 which claims priority under the provisions of 35 U.S.C. §119 based upon U.S. Provisional Application No. 60/970,199 filed Sep. 5, 2007, which are each incorporated by reference in their entirety for all purposes.

BACKGROUND

This invention relates to semiconductor processing. More particularly, this invention relates to a processing system and a method of site-isolated vapor based processing to facilitate combinatorial film deposition and integration on a substrate.

Chemical Vapor Deposition (CVD) is a vapor based deposition process commonly used in semiconductor manufacturing including but not limited to the formation of dielectric layers, conductive layers, semiconducting layers, liners, barriers, adhesion layers, seed layers, stress layers, and fill layers. CVD is typically a thermally driven process whereby the precursor flux(es) are pre-mixed and coincident to the substrate surface to be deposited upon. CVD requires control of the substrate temperature and the incoming precursor flux(es) to achieve desired film materials properties and thickness uniformity. Derivatives of CVD based processes include but are not limited to Plasma Enhanced Chemical Vapor Deposition (PECVD), High-Density Plasma Chemical Vapor Deposition (HDP-CVD), Sub-Atmospheric Chemical Vapor Deposition (SACVD), laser assisted/induced CVD, and ion assisted/induced CVD.

As device geometries shrink and associated film thickness decrease, there is an increasing need for improved control of the deposited layers. A variant of CVD that enables superior step coverage, materials property, and film thickness control is a sequential deposition technique known as Atomic Layer Deposition (ALD). ALD is a multi-step, self-limiting process that includes the use of at least two precursors or reagents. Generally, a first precursor (or reagent) is introduced into a processing chamber containing a substrate and adsorbs on the surface of the substrate. Excess first precursor is purged and/or pumped away. A second precursor (or reagent) is then introduced into the chamber and reacts with the initially adsorbed layer to form a deposited layer via a deposition reaction. The deposition reaction is self-limiting in that the reaction terminates once the initially adsorbed layer is consumed by the second precursor. Excess second precursor is purged and/or pumped away. The aforementioned steps constitute one deposition or ALD "cycle." The process is repeated to form the next layer, with the number of cycles determining the total deposited film thickness. Different sets of precursors can also be chosen to form nano-composites comprised of differing materials compositions. Derivatives of ALD include but are not limited to Plasma Enhanced Atomic Layer Deposition (PEALD), radical assisted/enhanced ALD, laser assisted/induced ALD, and ion assisted/induced ALD.

Presently, conventional vapor-based processes such as CVD and ALD are designed to process uniformly across a full wafer. In addition, these CVD and ALD processes need to be integrated into process/device flows. Uniform processing results in fewer data per substrate, longer times to accumulate a wide variety of data and higher costs associated with obtaining such data.

As part of the discovery, optimization and qualification process for new ALD and CVD films, the invention enables one to test i) more than one material, ii) more than one processing condition, iii) more than one sequence of processing conditions, and iv) more than one process sequence integration flow on a single monolithic substrate without the need of consuming the equivalent number of monolithic substrates per material(s), processing condition(s), sequence(s) of processing conditions, sequence(s) of processes, and combinations thereof. This can greatly improve both the speed and reduce the costs associated with the discovery, implementation, optimization, and qualification of new CVD and ALD based material(s), process(es), and process integration sequence(s) required for manufacturing. The invention provides systems, components, and method for processing substrates in a combinatorial manner through the variation of constituent parts of a fluid volume.

BRIEF DESCRIPTION OF THE DRAWINGS

The present invention will be readily understood by the following detailed description in conjunction with the accompanying drawings. Like reference numerals designate like structural elements.

DETAILED DESCRIPTION

Figure 1:
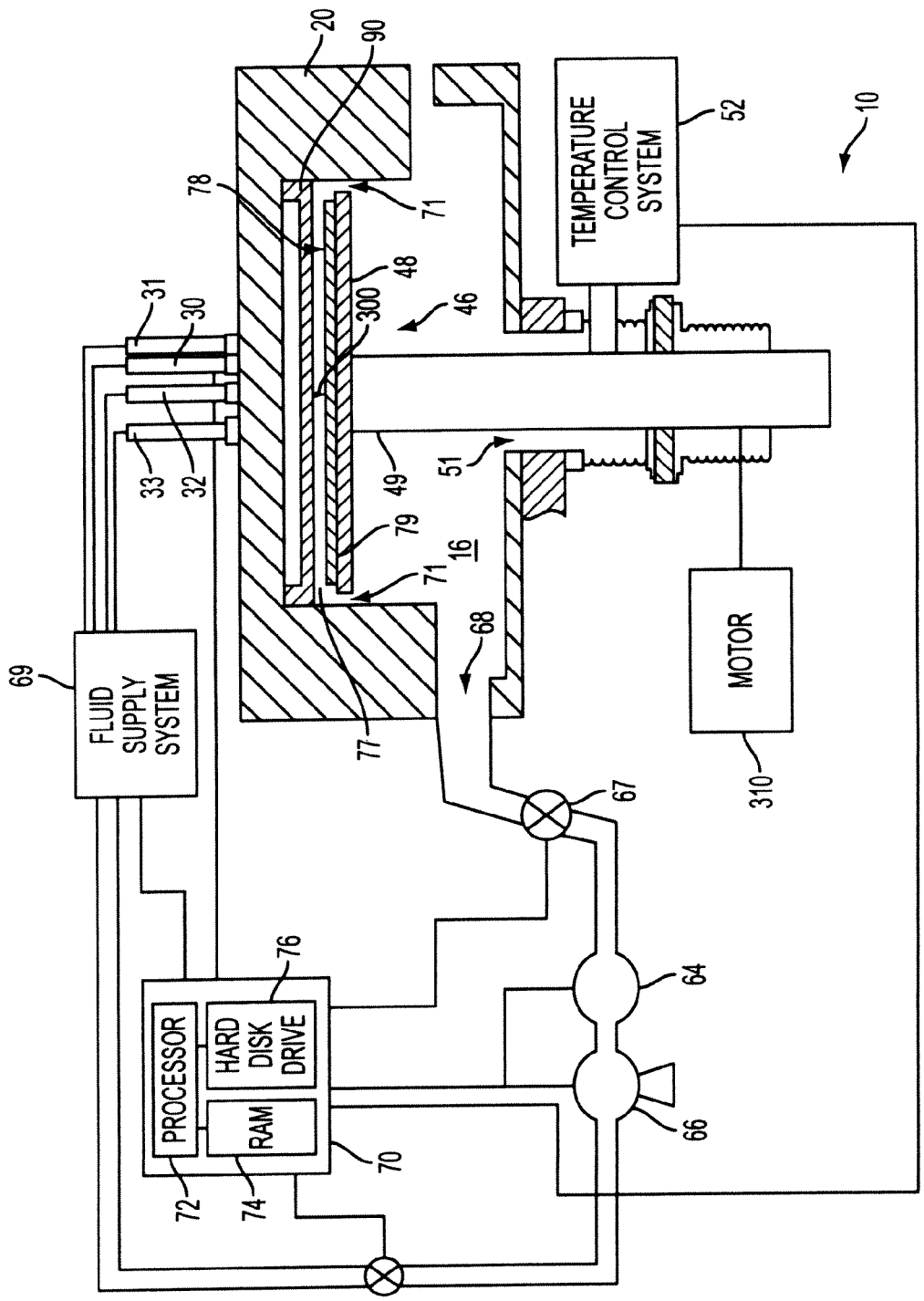
FIG. 1 is a detailed cross-sectional view of a system in accordance with one embodiment of the present invention.

The embodiments described herein provide a method and system for evaluating materials, unit processes, and process integration sequences to improve semiconductor manufacturing operations. It will be obvious, however, to one skilled in the art, that the present invention may be practiced without some or all of these specific details. In other instances, well known process operations have not been described in detail in order not to unnecessarily obscure the present invention.

The embodiments described herein enable the application of combinatorial techniques to deposition process sequence integration in order to arrive at a globally optimal sequence of semiconductor manufacturing operations by considering interaction effects between the unit manufacturing operations on multiple regions of a substrate concurrently, Specifically, multiple process conditions may be concurrently employed to effect such unit manufacturing operations, as well as material characteristics of components utilized within the unit manufacturing operations, thereby minimizing the time required to conduct the multiple operations. A global optimum sequence order can also be derived and as part of this technique, the unit processes, unit process parameters and materials used in the unit process operations of the optimum sequence order are also considered.

The embodiments are capable of analyzing a portion or sub-set of the overall deposition process sequence used to manufacture a semiconductor device. The process sequence may be one used in the manufacture of integrated circuits (IC) semiconductor devices, flat panel displays, optoelectronics devices, data storage devices, magneto electronic devices, magneto optic devices, packaged devices, and the like. Once the subset of the process sequence is identified for analysis, combinatorial process sequence integration testing is performed to optimize the materials, unit processes and process sequence for that portion of the overall process identified. During the processing of some embodiments described herein, the deposition may be used to form structures or modify structures already formed on the substrate, which structures are equivalent to the structures formed during manufacturing of substrates for production. For example, structures on semiconductor substrates may include, but would not be limited to, trenches, vias, interconnect lines, capping layers, masking layers, diodes, memory elements, gate stacks, transistors, or any other series of layers or unit processes that create a structure found on semiconductor chips. The material, unit process and process sequence variations may also be used to create layers and/or unique material interfaces without creating all or part of an intended structure, which allows more basic research into properties of the resulting materials as opposed to the structures or devices created through the process steps. While the combinatorial processing varies certain materials, unit processes, or process sequences, the composition or thickness of the layers or structures or the action of the unit process is preferably substantially uniform within each region, but can vary from region to region per the combinatorial experimentation.

The result is a series of regions on the substrate that contain structures or results of unit process sequences that have been uniformly applied within that region and, as applicable, across different regions through the creation of an array of differently processed regions due to the design of experiment. This process uniformity allows comparison of the properties within and across the different regions such that the variations in test results are due to the varied parameter (e.g., materials, unit processes, unit process parameters, or process sequences) and not the lack of process uniformity. However, non-uniform processing of regions can also be used for certain experiments of types of screening. Namely, gradient processing or regional processing having non-uniformity outside of manufacturing specifications may be used in certain situations.

Combinatorial processing is generally most effective when used in a screening protocol that starts with relatively simple screening, sometimes called primary screening, and moves to more complex screening involving structures and/or electrical results, sometimes called secondary screening, and then moves to analysis of the portion of the process sequence in its entirety, sometimes called tertiary screening. The names for the screening levels and the type of processing and analysis are arbitrary and depend more on the specific experimentation being conducted. Thus, the descriptions above are not meant to be limiting in any fashion. As the screening levels progress, materials and process variations are eliminated, and information is fed back to prior stages to further refine the analysis, so that an optimal solution is derived based upon the initial specification and parameters.

In ALD, simple examples of conditions that may be varied, include the precursors, reagents, carrier gases, order of precursors, concentration of precursors/reagents, duration of precursor/reagent pulses, purge fluid species, purge fluid duration, partial pressures, total pressure, flow rates, growth rate per cycle, incubation period, growth rate as a function of substrate type, film thickness, film composition, nano-laminates (e.g., stacking of different ALD film types), precursor source temperatures, substrate temperatures, temperature for saturative adsorption, temperature window for ALD, temperature for thermal decomposition of the precursor(s), plasma power for plasma/ion/radical based ALD, etc. A primary screen may start with varying the precursor and purge fluid pulse durations and flows at increasing substrate temperatures to determine the ALD process window (a zone characterized by self-limiting deposition with weak temperature dependence) for a given film type. A secondary screen may entail stacking two or more such ALD films to vary the effective dielectric constant of a film stack in a simple MIM capacitor structure for example. The output of such a screen may be those candidates which yield the highest effective dielectric constant at the lowest leakage and remain stable through a high temperature (e.g. >500° C.) thermal anneal. The system and methods described below are useful to implement combinatorial experimentation as described above, and are particularly useful for ALD and CVD processing.

Fluid as used in this application refers to liquids, gases, vapors, i.e., a component that flows, and other types of fluids used in ALD and CVD processes and their variants and these terms are used interchangeably throughout this specification. A constituent component may be a liquid at some point in the system, the fluid may be converted to a gas, vapor or other such fluid before entering the processing chamber and being exposed to the substrate.

Referring to FIG. 1, a substrate processing system 10 in accordance with one embodiment of the present invention includes an enclosure assembly 12 formed from a process-compatible material, such as aluminum or anodized aluminum. Enclosure assembly 12 includes a housing 14, defining a processing chamber 16 and a vacuum lid assembly 20 covering an opening to processing chamber 16. Mounted to vacuum lid assembly 20 is a process fluid injection assembly that delivers reactive and carrier fluids into processing chamber 16. To that end, the fluid injection assembly includes a plurality of passageways 30, 31, 32 and 33 and a showerhead 90. The chamber housing 14, vacuum lid assembly 20, and showerhead 90 may be maintained within desired temperature ranges in a conventional manner. It should be appreciated that the Figures provided herein are illustrative and not necessarily drawn to scale.

A heater/lift assembly 46 is disposed within processing chamber 16. Heater/lift assembly 46 includes a support pedestal 48 connected to a support shaft 49. Support pedestal 48 is positioned between shaft 49 and vacuum lid assembly 20. Support pedestal 48 may be formed from any process-compatible material, including aluminum nitride and aluminum oxide ($Al_2O_3$ or alumina) and is configured to hold a substrate thereon, e.g., support pedestal 48 may be a vacuum chuck or utilize other conventional techniques such as an electrostatic chuck (ESC) or physical clamping mechanisms. Heater lift assembly 46 is adapted to be controllably moved so as to vary the distance between support pedestal 48 and the showerhead 90 to control the substrate to showerhead spacing. A sensor (not shown) provides information concerning the position of support pedestal 48 within processing chamber 16. Support pedestal 48 can be used to heat the substrate through the use of heating elements (not shown) such as resistive heating elements embedded in the pedestal assembly.

Figure 2:
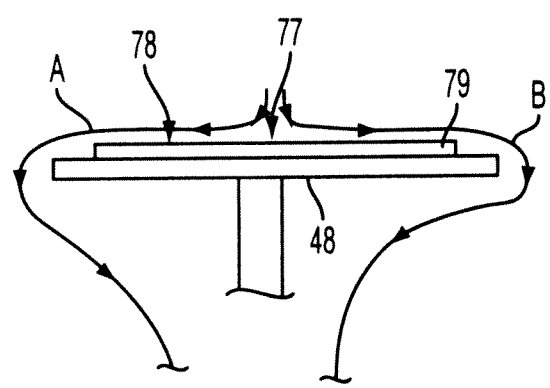
FIG. 2 is a simplified schematic view showing the flow of processing fluids in the system shown in FIG. 1.

Referring to both FIGS. 1 and 2 a fluid supply system 69 is in fluid communication with passageways 30, 31, 32 and 33 through a sequence of conduits. Flows of processing fluids, from fluid supply system 69, within processing chamber 16 are provided, in part, by a pressure control system that may include one or more pumps, such as turbo pump 64 and roughing pump 66 both of which are in fluid communication with processing chamber 16 via a butterfly valve 67 and pump channel 68. To that end, a controller 70 regulates the operations of the various components of system 10. Controller 70 includes a processor 72 in data communication with memory, such as random access memory 74 and a hard disk drive 76 and is in signal communication with pump system 64, temperature control system 52, fluid supply system 69 and various other aspects of the system as required. System 10 may establish conditions in a region 77 of processing chamber 16 located proximate to a surface 78 of a substrate 79 disposed on support pedestal 48 to form desired material thereon, such as a thin film. To that end, housing 14 is configured to create a peripheral flow channel 71 that surrounds support pedestal 48 when placed in a processing position to provide processing region 77 with the desired dimensions based upon chemical processes to be achieved by system 10. Pump channel 68 is situated in housing 14 so that processing region 77 is positioned between pump channel 68 and showerhead 90.

The dimensions of peripheral flow channel 71 are defined to provide a desired conductance of processing fluids therethrough which provide flows of processing fluids over a surface 78 of substrate 79 in a substantially uniform manner and in an axi-symmetric fashion as further described below. To this end, the conductance through pump channel 68 is chosen to be larger than the conductance through peripheral flow channel 71. In one embodiment, the relative conductive of processing fluids through pump channel 68 and peripheral flow channel 71 is, for example, 10:1, wherein the conductance of pump channel 68 is established to be at least ten (10) times greater than the conductance of processing fluids through peripheral flow channel 71. Such a large disparity in the conductance, which includes other ratios (e.g., 5:1, 8:1, 15:1 and other higher and lower ratios as applicable to the chamber and application), serves to facilitate axi-symmetric flow across the surface 78 of substrate 79 as shown by flows A and B moving through processing region 77 and subsequently passing substrate 79 and support pedestal 48 toward pump channel 68.

Figure 3:
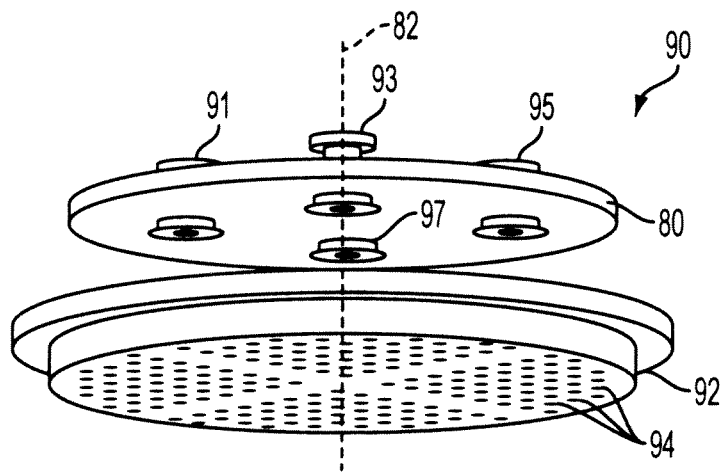
FIG. 3 is a bottom-up exploded perspective view of a showerhead assembly employed in the semiconductor processing system shown in FIG. 1, in accordance with a first embodiment.
Figure 4:
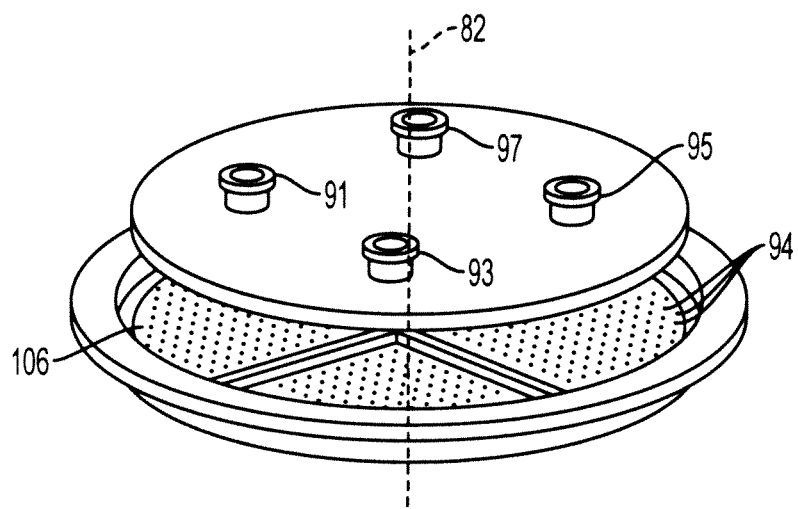
FIG. 4 is a top-down exploded perspective view of a showerhead shown in FIG. 3, in accordance with the present invention.

Referring to FIGS. 2, 3 and 4, to facilitate the occurrence of flows A and B, showerhead 90 includes a baffle plate 80 that is formed to be radially symmetric about a central axis 82, but need not be. Baffle plate 80 has a plurality of through ports 91, 93, 95 and 97 extending therethrough. Coupled to baffle plate 80 is a manifold portion 92 having a plurality of injection ports 94 extending through manifold portion 92. Manifold portion 92 is typically disposed to be radially symmetric about axis 82. Manifold portion 92 is spaced-apart from surface 86 to define a plenum chamber 106 therebetween. Manifold portion 92 may be coupled to baffle plate 80 using any means known in the semiconductor processing art, including fasteners, welding and the like. Baffle plate 80 and shower head 90 may be formed from any known material suitable for the application, including stainless steel, aluminum, anodized aluminum, nickel, ceramics and the like.

Figure 5:
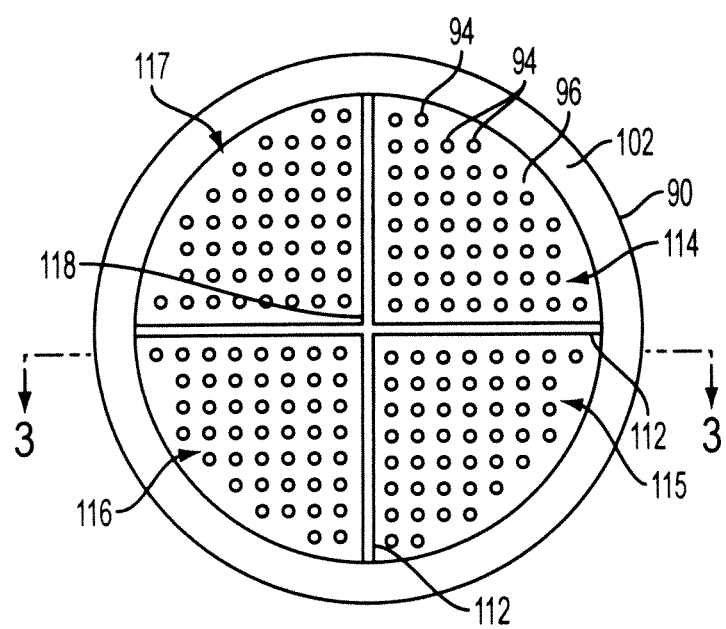
FIG. 5 is a top-down view of a manifold body of the showerhead shown in FIGS. 3 and 4.

Referring to FIGS. 3, 4 and 5, extending from manifold portion 92 is a fluid separation mechanism, or fluid separator, that includes a body 112 extending from manifold portion 92 toward baffle plate 80. The distance that body 112 extends from the surface is dependent upon the specific design parameters and may extend to cover part of the distance or the entire distance to create sectors within the plenum 106, as discussed more fully below. In one embodiment, body 112 may extend between the manifold 92 and baffle 80 in two orthogonal directions to create four regions, referred to as quadrants or sectors 114, 115, 116 and 117. Although four quadrants are shown, any number of sectors may be provided by adding additional body portions 112, depending upon the number of regions one wants to or can define on substrate 78. A vertex 118 of body 112 is generally aligned with axis 82. Passageways 30, 31, 32 and 33, shown in FIG. 1, are configured to direct fluid through corresponding ones of ports 91, 93, 95 and 97. In this manner, ports 91, 93, 95 and 97 are arranged to create flows of processing fluids that are associated with a corresponding one of quadrants 114-117. The body 112 provides sufficient separation to minimize, if not prevent, fluids exiting ports 91, 93, 95 and 97 from diffusing between adjacent quadrants 114-117. In this manner, each of the four ports 91, 93, 95 and 97 directs a flow of processing fluids onto one of quadrants 114-117 that differs from the quadrants 114-117 into which the remaining ports 91, 93, 95 and 97 direct flows of processing fluids.

Figure 6:
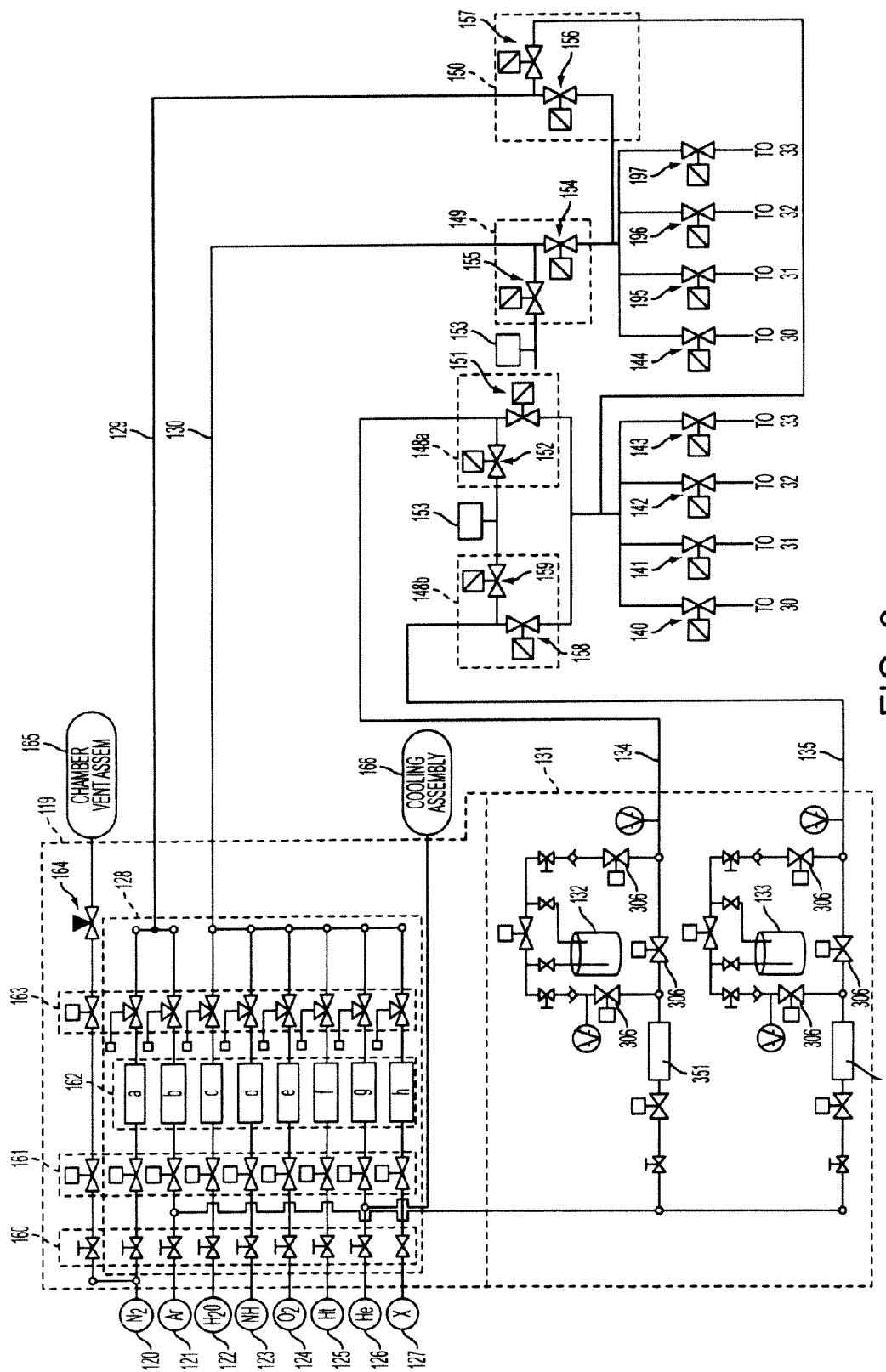
FIG. 6 is a plan view of a fluid supply system of a processing chamber shown in FIG. 1, in accordance with one embodiment of the present invention.

FIG. 6 illustrates one possible valving and system arrangement for the distribution and flowing of a precursor or reactive reagent to one sector at a time, normally in a serial manner. Other arrangements, as discussed below, are possible for serial, semi-parallel or parallel distribution and flowing of vapor through the showerhead sectors to the corresponding regions on substrate 79. Referring to both FIGS. 1 and 6, fluid supply system 69 includes two precursor/reagent subsystems 119 and 131 and various others valves, tubing and features. Reagent subsystem 119 includes a plurality of supplies of carrier or purge fluids or precursors 120-127 that may include nitrogen ($N_2$), argon (Ar), water ($H_2O$), ammonia ($NH_3$), oxygen ($O_2$), hydrogen, helium, ozone, silane, and any other precursor and/or carrier or purge fluid(s) (e.g., gases, vapors, etc.) used in ALD or CVD processing shown generally by additional reagents denoted by X of supply 127. A precursor distribution system 128 facilitates selective distribution between supplies 120-127 and one of two fluid lines 129 and 130. Precursor distribution system 128 facilitates selectively placing one or both of supplies 120-121 in fluid communication with (purge) fluid line 129 and facilitates selectively placing supplies 122-127 in fluid communication with (precursor) fluid line 130. Purge fluid line 129 may carry purge gases and Precursor fluid line 130 may carry precursors and/or reagents and/or their respective carrier gases. Reagent subsystem 131 allows distribution of precursors/reagents from supplies 132 and 133 to be selectively placed in fluid communication with reagent fluid lines 134 and 135, respectively. Supplies 132 and 133 may be for example, bubblers, ampoules, or solid source containers holding organometallic or halide precursors. Appropriate inert carrier gases (e.g., Ar 121 as shown) can be used to deliver precursors/reagents contained in supplies 132 and 133. Examples of precursors shown below for one embodiment include, but are not limited to, Tetrakis-ethylmethyl amido Hafnium (TEMAHf) for supply 132 and TriMethylAluminum (TMA) for supply 133. Alternate sources of Hafnium precursors include but are not limited to Tetrakis-diethylamido Hafnium (TDEAHf), Tetrakis-dimethyl amido Hafnium (TDMAHf), Hafnium tert-butoxide, Hafnium Chloride. The choice of precursors is not limited solely to those used as examples in the embodiment, namely Hafnium and Aluminum based precursors for sources 132 and 133 respectively.

The fluid supply system of FIG. 6 also includes first and second sets of injection valves 140-143 and 144-147, with injection valves 140-143 being selectively placed in fluid communication with reagent fluid lines 134 and 135 via reagent valve blocks 148a and 148b. Injection valves 144-147 are selectively placed in fluid communication with (precursor) fluid line 130 via precursor valve block 149 and with (purge) fluid line 129 via purge valve block 150. Injection valves 140-147 and valve blocks 148a, 148b, 149, and 150 may include any valve suitable for the deposition recipe, including hi-speed (e.g., pneumatic or piezoelectric) valves. Hi-speed valve 151 of valve block 148a selectively places injection valves 140-143 in fluid communication with reagent fluid line 134, and hi-speed valve 158 of valve block 148b selectively places injection valves 140-143 in fluid communication with reagent fluid line 135. Hi-speed valve 152 selectively places reagent fluid line 134 in fluid communication with a foreline 153 to exhaust reagent fluids therefrom, and hi-speed valve 159 selectively places reagent fluid line 135 in fluid communication with a foreline 153 for the same purpose. Hi-speed valve 154 of valve block 149 selectively places injection valve 144-147 in fluid communication with precursor fluid line 130, and hi-speed valve 155 selectively places precursor fluid line 130 in fluid communication with foreline 153 to exhaust reagent fluids therefrom. Purge valve block 150 also includes a pair of hi-speed valves 156 and 157, with hi-speed valve 157 selectively placing injection valves 140-143 in fluid communication with (purge) fluid line 129, and hi-speed valve 156 selectively placing injection valves 144-147 in fluid communication with (purge) fluid line 129.

The components of precursor/reagent subsystems 119 and 131 may differ dependent upon the application and system specifications. In the present embodiment subsystem 119 includes a plurality of manual isolation valves 160, each of which is coupled between one of supplies 120-127 and one of a plurality of two-port valves 161. A plurality of mass flow controllers 162 are coupled between a subset of the plurality 161 of two-port valves and a subset of a plurality of three-port single out line valves 163. An optional needle valve 164 is selectively placed in fluid communication with supply 120, which may contain $N_2$, via one of valves 163, one of valves 161 and one of isolation valves 160, thereby defining an exhaust path. Needle valve 164 selectively places the exhaust path in fluid communication to a chamber vent portion 165. Supply 126 of He may be placed in fluid communication to the backside of the substrate to facilitate thermal coupling of a temperature controlled (e.g., heated) pedestal to the wafer to facilitate uniform substrate temperature control.

Referring to FIGS. 1, 5, 6 and 7, substrate processing system 10 allows spatial and temporal modulation of the presence and constituent components of processing fluids upon different regions of substrate 79 to effect combinatorial process experimentation. Valves of fluid supply system 69 are operated under control of controller 70 such that processing fluids propagate and are provided to quadrants 114-117 of showerhead 90 for delivery to process chamber 16 and substrate 79 located therein. Assume that logic diagrams 184, 185, 186, 187, 188, 189, 190, 191, 192, 193, 194, 195, 196, 197, 198, 199 correspond to the operational states of valves 159, 158, 157, 156, 155, 154, 152, 151, 147, 146, 145, 144, 143, 142, 141, 140, respectively. For each of logic diagrams 184-199 a "0" logic state indicates that the corresponding valves are off precluding fluid flow between the input and output thereof, and a "1" logic state indicates that the corresponding valve has been activated allowing fluid to propagate between an input and output thereof. Logic diagrams 200, 201, 202, 203 and 204 correspond to the quantity of carrier flow for reagent 127 (e.g., ozone), reagent 122 (e.g., water vapor), purge fluid 121 (e.g., Ar), precursor 133 (e.g., Al containing precursor) and precursor 132 (e.g., Hf containing precursor), respectively. As shown, flows of precursor 133, precursor 132 and argon 121, which may function as both a carrier and a purge fluid, are maintained by fluid supply system 69 during processing. Through appropriate sequential activation and deactivation of injection valves and hi-speed valves, the choice of chemistry can be achieved above the desired substrate in process chamber 16 at the desired time and the desired quadrant(s).

Figure 7:
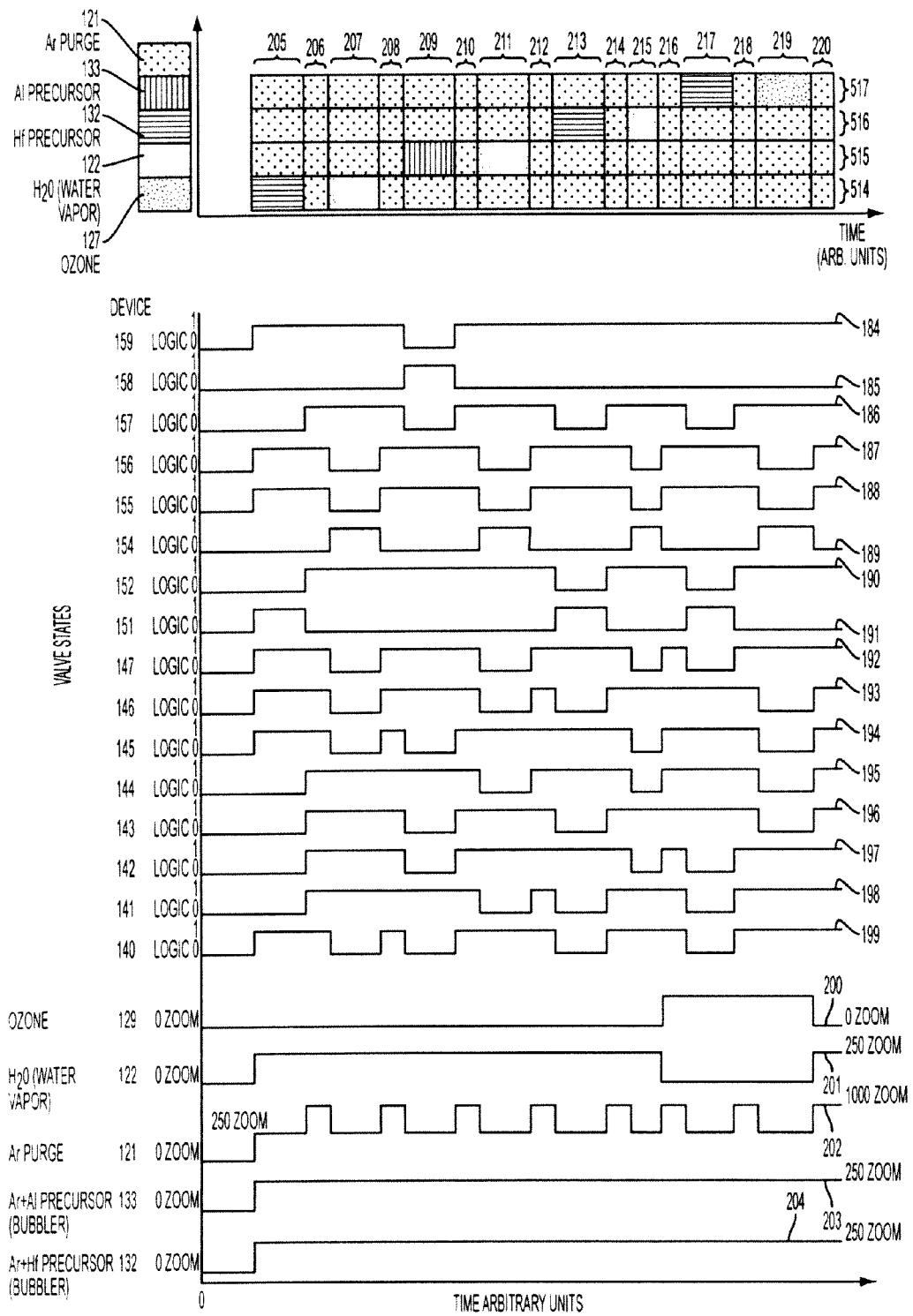
FIG. 7 is a graphical representation of the operation of the fluid supply system shown in FIG. 6 and the resulting distribution of processing fluids exiting the showerhead shown in FIGS. 3, 4 and 5.

Referring to FIG. 7, during time period 205 purge fluid 121 and precursor 132 are present in process chamber 16, however precursor 132 flows only through quadrant 514 with its carrier gas, while purge gas is made available in quadrants 515-517, as described more fully below. This result is achieved due to sequencing of hi-speed valves; valve 154 being closed and valve 155 being open directs fluids from line 130 to the foreline 153, while valve 158 being closed and valve 159 being open directs precursor 133 through line 135 to the foreline 153, thereby by-passing the process chamber 16. Valve 157 being closed and valve 156 being open directs the purge gas to valves 144-147, at which point valve 144 being closed and valves 145-147 being open causes the 750 sccm purge gas to be split evenly between quadrants 515-517. This results in 250 standard cubic centimeters per minute (sccm) of purge gas to flow through each of the quadrants 515-517 respectively, while only valve 140 being open in valve block 140-143 causes 250 sccm of carrier gas carrying precursor 132 to flow through quadrant 514 with valve 151 open and valve 152 closed. Note the total flow through the chamber during time period 205 is 1000 sccm, with 250 sccm each of purge gas flowing through quadrants 515-517, and 250 sccm of carrier gas containing precursor 132 flowing through quadrant 514. It is important to note that the amount of precursor vapor carried within the carrier gas is less than or equal to approximately 1 sccm equivalent in most cases due to the low vapor pressure of most precursor materials. A person skilled in the art will appreciate that the total flow is not limited to only 1000 sccm as used in this embodiment, however could be any total flow (e.g. 50 to 5000 sccm) sufficient to achieve site isolated processing dependent on chamber geometry and pumping capacity. During time period 206, purge fluid 121 is available throughout processing chamber 16, while both precursors 133 and 132 are diverted to the pumping system, thereby avoiding process chamber 16 during this time period. Excess precursor 132 is removed from the processing region 77 during this period. The precursors, reagents and purge gases used in the process are always flowing from the supply source and by manipulating the valve logic, they are either made available to flow through the chamber 16 or diverted to the pump foreline 153 (i.e., roughing pump 66 of FIG. 1). This approach avoids process inefficiencies that might occur during the flow stabilization period of the mass flow controller or liquid flow controllers for every given setpoint from off-state. At this stage, quadrant 514 has been exposed to precursor and therefore the region of surface 78 of substrate 79 corresponding to quadrant 514 has a layer of precursor 132 adsorbed to the surface thereof.

The valves in FIG. 6 are operated to maintain a constant flow rather than shutting off fluid flows so as to avoid bursts and maintain the desired flow rates when valves are opened to provide fluid to showerhead assembly and the processing chamber. In addition, the system is run to ensure substantially equal flows across the regions to prevent diffusion across the boundaries. For example, if quadrant 514 has a flow rate of 250 sccm of carrier gas and 1 sccm equivalent of precursor, then quadrants 515-517 should have at least 250 sccm (750 sccm total) delivered to each quadrant. The 1 sccm difference added by the precursor does not affect the system as a whole because of the small flow differential and the rapid flow of the fluid (short residence time) within the processing region 77 compared to that difference. In an alternative embodiment, the flows in the quadrants that are providing purge gasses are made higher than the region being processed (e.g., containing precursors and/or reactive reagents), so that any diffusion moves from the purged areas into the region where a film is being grown (e.g., adsorbed or deposited). Since the purged areas contain inert purge gas, such diffusion does not deleteriously affect the regions being processed.

During time period 207, reagent 122 (e.g., $H_2O$ vapor) is made available to quadrant 514, while simultaneously quadrants 515-517 are exposed to purge fluid 121, in the absence of any additional processing fluids. During time period 207, the reagent 122 reacts with the adsorbed layer of precursor 132 on the region of surface 78 of substrate 79 corresponding to quadrant 514 to form a layer of the desired film (e.g., hafnium oxide). In time period 208, the chamber is purged and excess reagent 122 is removed from the processing region 77. Time periods 205 through 208 represent one ALD cycle and can be repeated to achieve the desired film thickness (not shown, e.g., repeated operations during time periods 205-208 prior to moving to the operation for time period 209). It is prudent to note that during time period 205-208, quadrants 515-517 are exposed to purge fluid 121, hence retaining the corresponding regions of substrate 79 in their original state, i.e., the original state being defined as the state of substrate 79 at the start of the process cycle, t=0, which corresponds to the start of time period 205. With reference to time period 209, it is apparent that quadrant 515 is exposed to precursor 133, while quadrants 514, 516-517 are exposed to purge fluid 121 in the absence of any additional processing fluids. This result is achieved by setting the correct logic states for the valve states as indicated in the logic state diagram. One skilled in the art could appreciate how such processing and film growth moves sequentially from quadrant 514 through 517 and returns to 514 for subsequent cycles of processing.

It should be appreciated that time periods 205-208 vs. 209-212 illustrate site isolated combinatorial processing on a substrate whereby the first precursor type is varied in addition to the location of desired processing. Time periods 213-216 illustrates variation in the duration of the second reagent pulse in addition to the location of desired processing. Time periods 217-220 illustrates variation in the type of the second reagent in addition to the location of desired processing. Through careful considerations and proper choice of precursors stored in supplies 132, 133, reagents supplied independently or in combination from supplies 122-127, and purge fluid 120-121, it is possible to modulate the film properties obtained across the four quadrants 514-517. Additionally, film thickness, film sequence, film stacking (e.g., nano-laminates), film composition, co-injection (e.g. of 2 or more source precursors within one region) can be varied in a site-isolated fashion. In addition to site isolated variation, chamber wide process variations can include, but are not limited to, flow rates, chamber pressures, conductance (e.g., via butterfly valve), pulse duration(s), precursor/reagent source temperatures, delivery line temperatures, substrate temperature, showerhead temperature, chamber body temperature, etc. Some of these variations are also possible to conduct in a site isolated fashion, such as source and delivery line temperatures as well as others.

Referring to FIGS. 1, 4, 8A and 8B, fluid distribution system 69 allows a carrier, precursor and reagent fluid into processing chamber 16 to provide, from the selected fluids, a volume of fluid passing over surface 78 of substrate 79. Portions of the fluid volume have different constituent components so that differing regions of surface 78 of substrate 79 may be exposed to those different constituent components at the same time. The volume of fluid passing over surface 78 is generated by processing fluids propagating via injection ports 94 into processing chamber 16. The fluid distribution system enables exposing each of regions 514-517 of surface 78 to the constituent components of the portion of the volume of fluid propagating through injection ports 94 associated with one of showerhead sectors 114-117 corresponding therewith (i.e., directly above or in superimposition with). Each region 514-517 of substrate 79 is exposed to the fluid volume from the sectors 114-117 that is corresponding therewith without being exposed to constituent components of the portion of the volume of fluid propagating through the other sectors 114-117. In the present example, sector 114 corresponds with region 514, sector 115 corresponds with region 515, sector 116 corresponds with region 516 and sector 117 corresponds with quadrant 517. The sectors can correspond with other regions of the substrate, or the corresponding sector and region can be changed during in between processing by rotating the substrate relative to the showerhead (e.g., by a full or partial region/quadrant).

Substrate processing system 10 operates to minimize propagation of a portion of the processing volume produced by processing fluids from injection ports 94 of quadrant 114 into the remaining quadrants 115-117. Therefore, exposure of regions 515-517 of substrate surface 78 to this portion of the processing volume is minimized Region 514 that corresponds with quadrant 114 is exposed to substantially the entire volume of this portion. Similarly, the propagation of the processing volume produced by processing fluids from a quadrant, e.g., 115-117, into the regions, e.g., 515-517, not corresponding to, i.e., not in superimposition with, that quadrant is minimized. Thus, the region 515, 516 and 517 that corresponds with quadrant 115, 116 and 117, respectively, is exposed to substantially the entire volume of that portion. The ability to direct the flow of fluids from a sector of the showerhead to the corresponding region on the wafer without significant lateral diffusion (i.e., enough diffusion to effect the processing or make comparisons between the processing of the regions unreliable) between the regions is enabled by the showerhead design, system pressure, fluid distribution system, fluid distribution valving, fluid distribution, fluid flow, chamber design, system operation, and other features discussed herein.

For example, one manner in which to ensure that the processing fluids exiting injection ports 94 do not propagate into a region 514-517 of surface 78 that does not correspond to the correct one of quadrants 114-117 is by controlling the propagation of flows of processing fluids through processing chamber 16. Specifically, conditions are established in processing chamber 16 to generate flows of processing fluids along a direction 300 towards the substrate surface 78 and radially symmetric across and around substrate 79 (FIGS. 1, 2, 8A and 8B), and thereby impede or discourage movement of the processing fluids back towards showerhead 90, i.e., opposite to direction 300. This is achieved, in part, by fluid supply system 69 and pressure control system (which includes pumps 64 and 66, valve 67 and channel 68, shown in FIG. 1, and which can include other possible configurations) operating to generate an axisymmetric flow of processing fluids over surface 78. To that end, the pressure control system generates a flow in pump channel 68 that results in processing fluid propagating outwardly toward a periphery of substrate 79 shown by arrows 304 in FIGS. 8A and 8B. Thereafter, the processing fluids move past substrate 79 away from showerhead 90 and exit processing chamber 16 via pump channel 68. By controlling the flow of gases, there is little or no diffusion between the regions, as shown by region 520 in FIG. 8B.

In one embodiment, an outer periphery of the substrate is chosen to provide a substantially equal conductance about a periphery of substrate 79 in response to the pumping action generated by pumps 64 and 66. The dimensions of peripheral flow channel 71 are defined to provide a desired conductance of processing fluids therethrough which provide flows of processing fluids over surface 78 of substrate 79 in a substantially uniform and axi-symmetric fashion. The conductance through pump channel 68 is chosen to be larger than the conductance through peripheral flow channel 71. In one embodiment, the relative conductive of processing fluids through pump channel 68 and peripheral flow channel 71 is, for example, 10:1, wherein the conductance of pump channel 68 is established to be at least ten (10) times greater than the conductance of processing fluids through peripheral flow channel 71. Such a large disparity in the conductance, which includes other ratios, serves to facilitate axi-symmetric flow across the surface 78 of substrate 79 as shown by the vector flows in FIG. 8B and flows A and B in FIG. 2 moving through processing region 77 and subsequently passing substrate 79 and support pedestal 48 toward pump channel 68.

In addition, in cooperation with the evacuation of processing fluids from processing chamber 16, fluid supply system 69 controls the distribution of the processing fluids so that the total flow through the showerhead assembly is symmetric through the four quadrants although the constituent processing fluids per quadrant may be altered as a function of time in one embodiment. This serves to facilitate axi-symmetric flow. Moreover, the chamber pressure can be controlled to a fixed pressure (e.g., 1 mTorr to 10 Torr) using butterfly valve 67 during such operations. In addition, other chamber wide parameters can be controlled by known techniques.

Figure 8A:
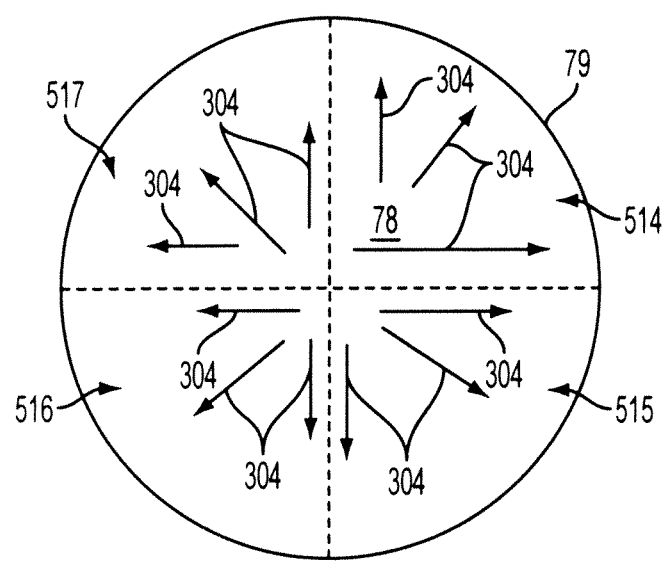
FIG. 8A is a top down plan view showing movement of processing fluids over a surface of a substrate disposed in a processing region, shown in FIG. 1, in accordance with the present invention.
Figure 8B:
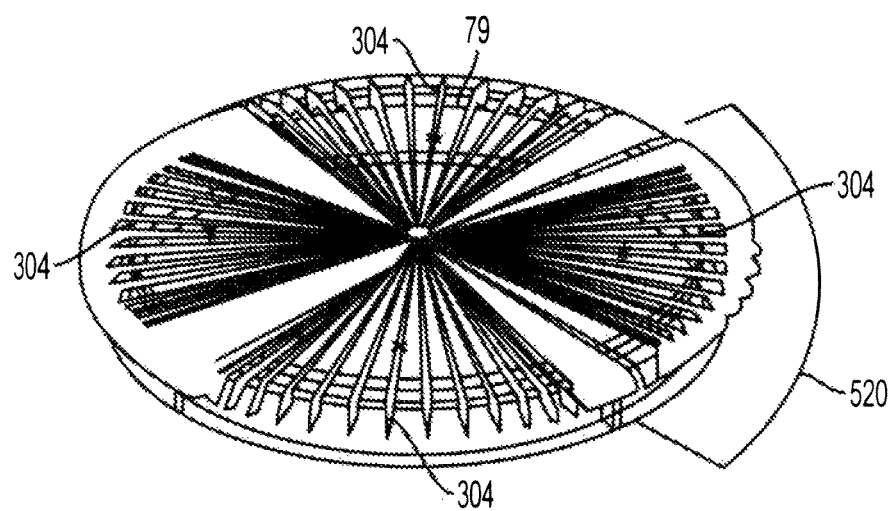
FIG. 8B is a simplified schematic diagram illustrating the flow vectors for the axi-symmetric segmented gas flow enabling species isolation to define segregated sectors of the wafer surface in accordance with one embodiment of the invention.
Figure 9:
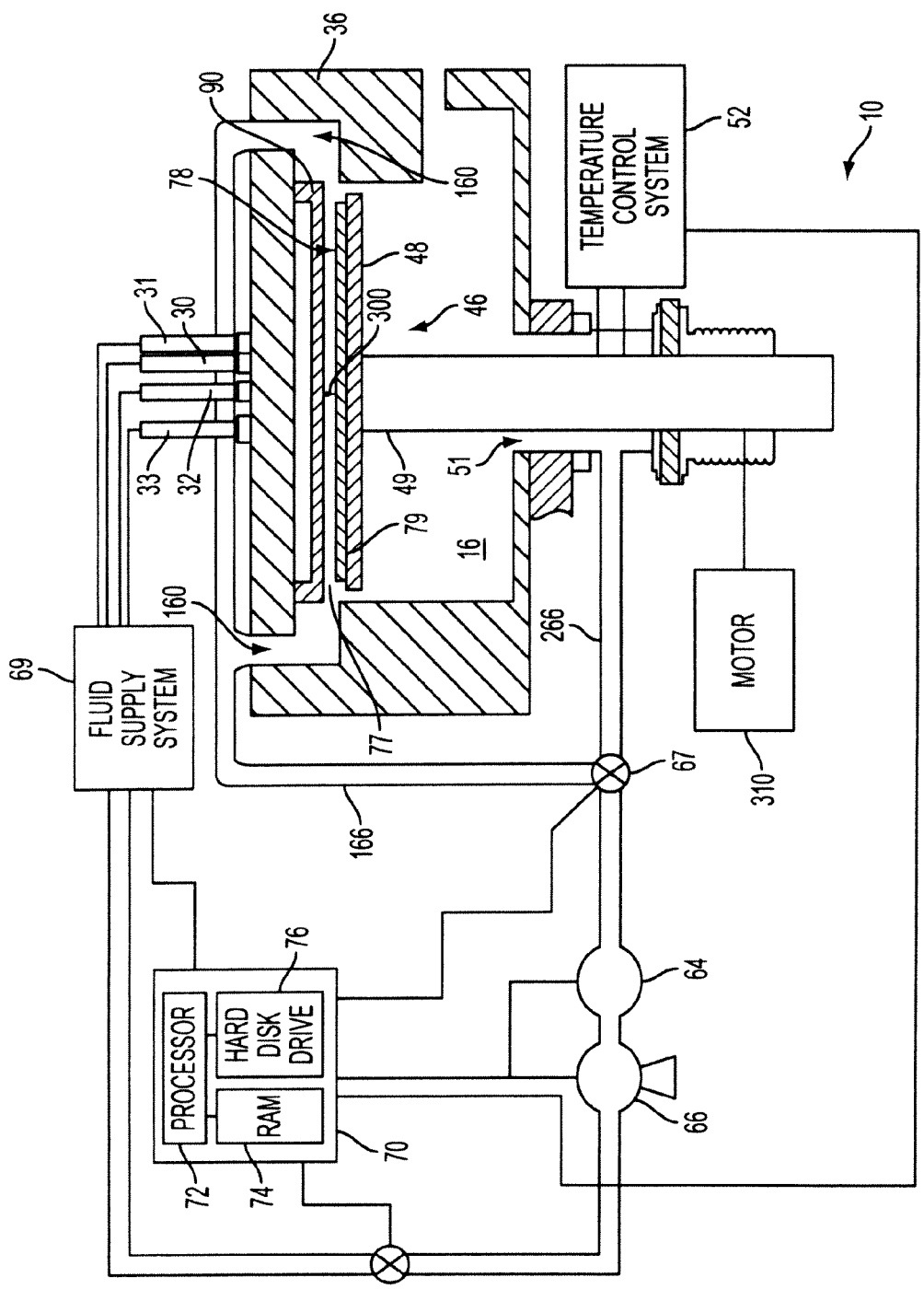
FIG. 9 is a detailed cross-sectional view of the system shown in FIG. 1 in accordance with a first alternate embodiment of the present invention.
Figure 10:
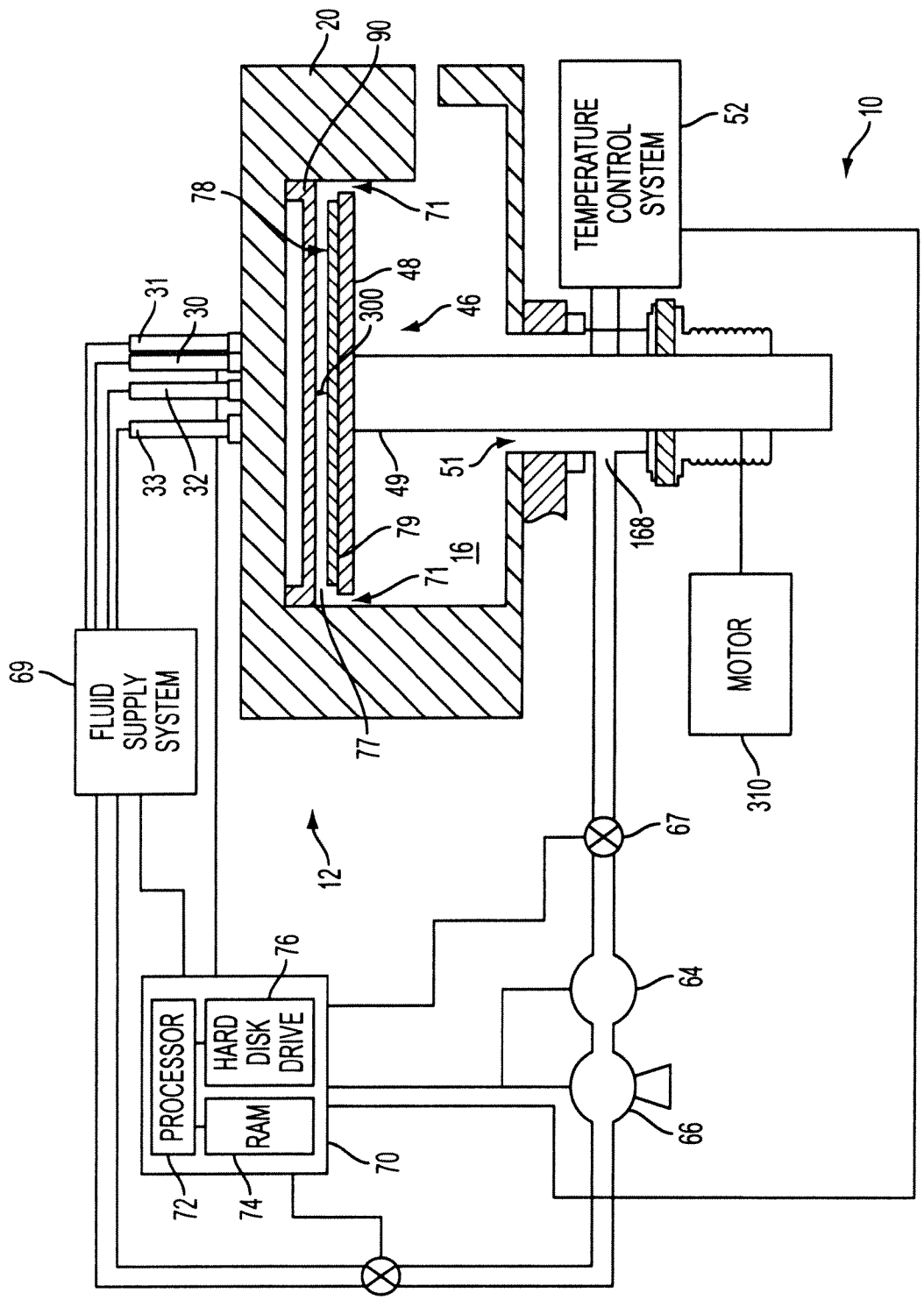
FIG. 10 is a detailed cross-sectional view of the system shown in FIG. 1 in accordance with a second alternate embodiment of the present invention.

Referring to FIGS. 1, 9, and 10 pump channel 68 from FIG. 1 may be placed in other areas of chamber 16 and provide the same axisymmetric flow necessary to prevent and/or reduce interdiffusion between the regions, as described elsewhere herein. For example, referring to FIG. 9, an evacuation channel 166 may be positioned so that pump channel 160 partially or totally surrounds showerhead 90. Although not necessary, in the present embodiment, part of evacuation channel 166 and pump channel 160 are formed in lid 20 and are in fluid communication with pump system 64. Pump channel 160 is configured to have processing fluid propagating outwardly toward a periphery of substrate 79 shown by arrows 304 in FIGS. 8A and 8B. Channel 266 provides an alternative route for the process gasses to exit to facilitate axisymmetrical flow in one embodiment of the invention. The evacuation route is controlled by the position of valve 67.

Referring to FIG. 10, opening 51 may facilitate evacuation of chamber 16 by virtue of channel 168 pumping the gases from beneath substrate pedestal 48 in a symmetric manner in order to produce a propagation of processing fluid in an axisymmetric manner to avoid interdiffusion between regional volumes across substrate 79, as shown by arrows 304 of FIG. 8A and vectors in FIG. 8B.

In addition to enabling combinatorial processing, the system also allows for full wafer or conventional processing of the substrate without a vacuum break. By flowing the same fluid through each of passageways 30-33, each quadrants 114-117, shown in FIGS. 3, 4, and 5 of manifold body 80 will provide a flow of the same fluid across its corresponding region of substrate 79, which creates a uniform flow of processing fluids over the surface of substrate 79. This facilitates the use of system 10 as a conventional processing system, as well as a combinatorial processing system. Therefore, the same chamber can be used to enable conventional and combinatorial processing without modification, except for turning selected valves on/off correctly to distribute the desired processing fluids into chamber 16, shown in FIG. 1. This ability enables substrate 79 to be processed with any variation in sequence of combinatorial and conventional processing without moving substrate 79 between tools or chambers within one tool. Thus, these two types of processing can be conducted without removing parts, and merely by altering the switching logic of valves which control the gases.

Figure 11A:
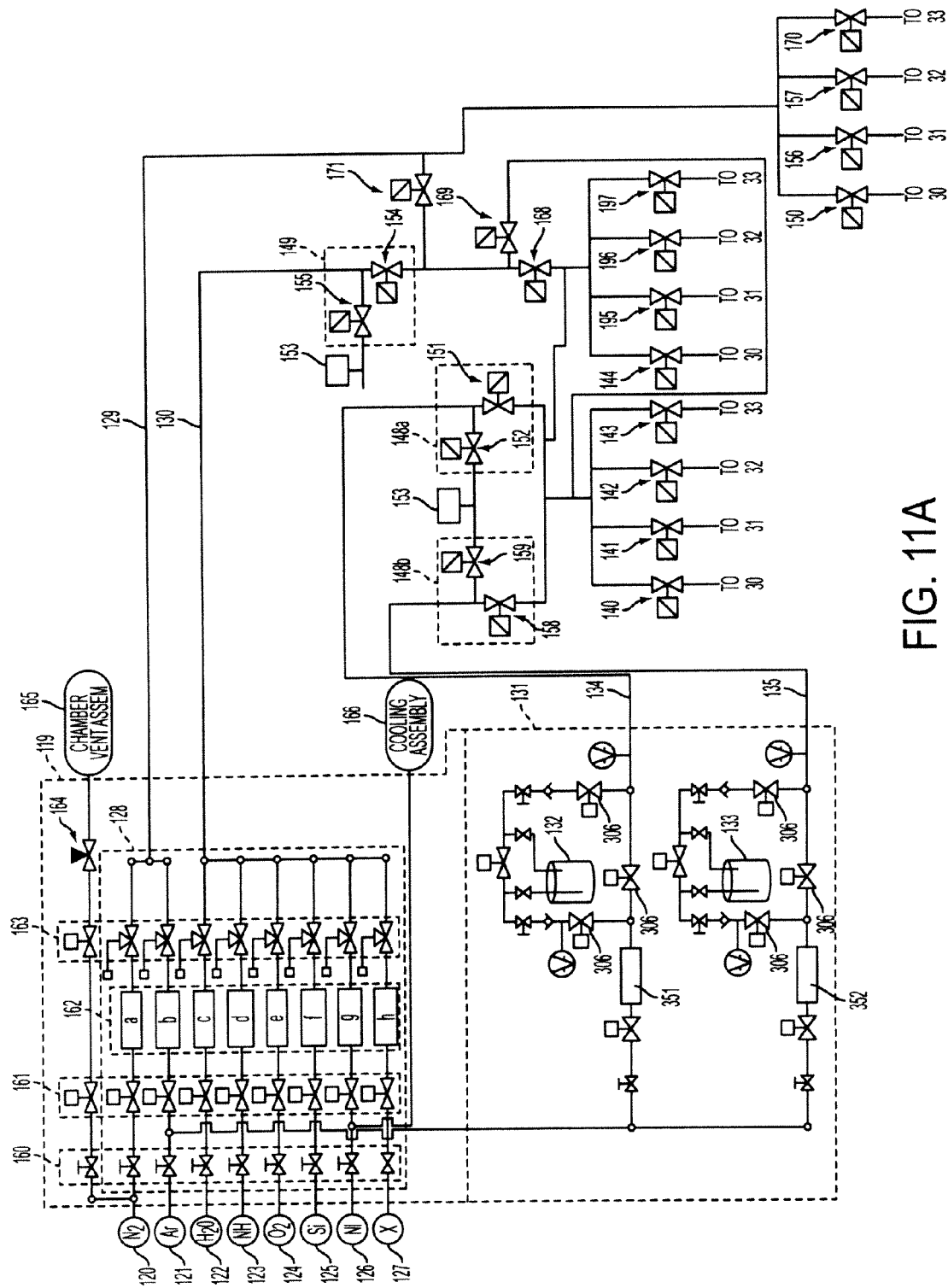
FIG. 11A is a plan view of a fluid supply system of the processing chamber shown in FIG. 1, in accordance with an alternate embodiment of the present invention.

Referring to FIGS. 1, 4 and 11A another embodiment of fluid supply system 69 includes precursor/reagent subsystems 119 and 131, valve blocks 148a, 148b and 149. An additional set of valves 150, 156, 157 and 170 are in fluid communication with passageways 30-33 to facilitate delivering processing gases to more than one of quadrants 114-117 concurrently. To that end, valve 151 of valve block 148a functions to selectively place fluid line 134 in fluid communication with valves 144, 145, 146 and 147, thereby facilitating concurrent introduction of processing fluids into processing chamber 16 from fluid lines 134 and 135. Valve 168 facilitates selectively placing processing fluids in fluid line 130 in fluid communication with valves 144-147, and valve 169 facilitates selectively placing processing fluids in fluid line 130 in fluid communication with valves 140-143. Valve 171 facilitates selectively placing processing fluids in fluid line 130 in fluid communication with valves 150, 156, 157 and 170. Greater flexibility in the constituent components in the processing volume proximate to surface 78 is afforded with this valve configuration.

Figure 11B:
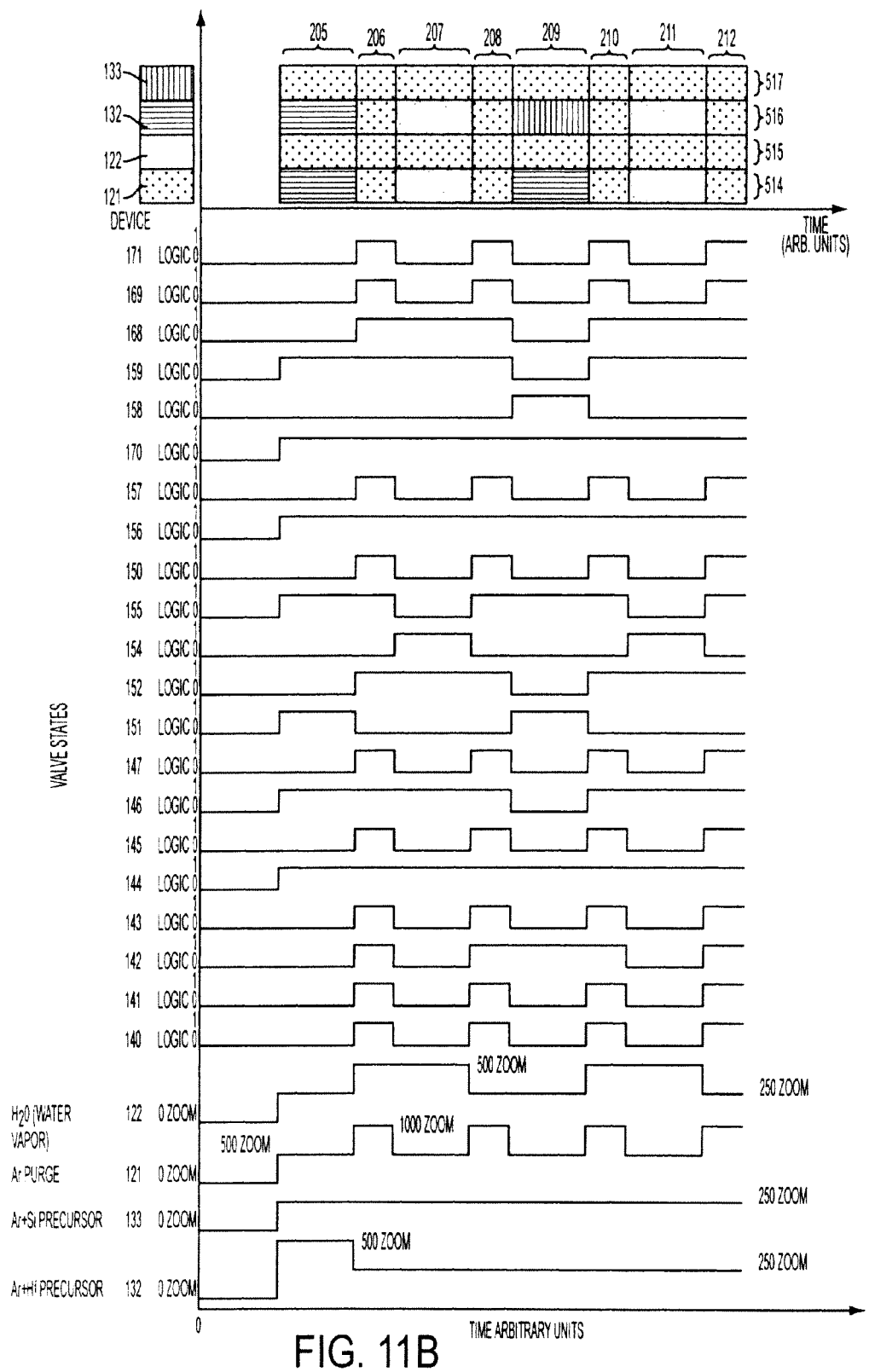
FIG. 11B is a graphical representation of the operation of the fluid supply system shown in FIG. 11A as it relates to the substrate in FIGS. 8A and 8B.

As shown in FIG. 11B, using the fluid supply system of FIG. 11A two regions of substrate 79, shown in FIGS. 8A and 8B, can be exposed to precursors (same or different by region) at the same time (i.e., in parallel). In FIG. 11B, Regions 514 and 516 are processed in parallel in a similar fashion for the first ALD cycle (i.e., steps 205, 206, 207, 208), whereas regions 514 and 516 are processed in parallel in a different fashion (i.e., different reagents in step 209) in the second ALD cycle (i.e., steps 209, 210, 211, 212). In FIG. 11B, each precursor/reagent step is followed by a chamber purge across all regions, as shown, but need not be. For example in another embodiment (not shown), after regions 514 and 516, of FIG. 8, are exposed to a precursor(s), they can be purged while regions 515 and 517 are concurrently exposed to a precursor(s), etc. Other processing variations can be created using the fluid supply system of FIG. 11A. Moreover, other valving systems can also be created to allow all or any subset of the regions to receive precursors or reagents in a parallel fashion.

Figure 12:
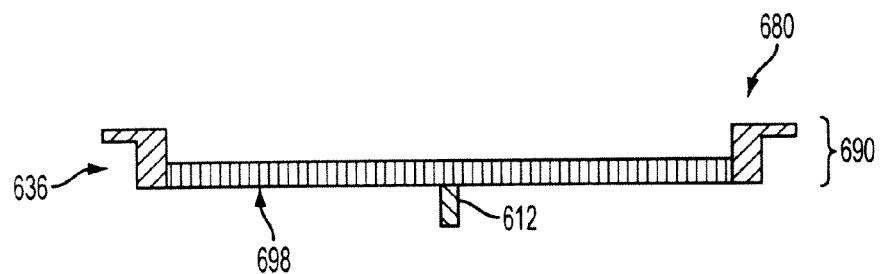
FIG. 12 is a cross-sectional view of the manifold body shown in FIG. 4 in accordance with an alternate embodiment of the present invention.
Figure 13:
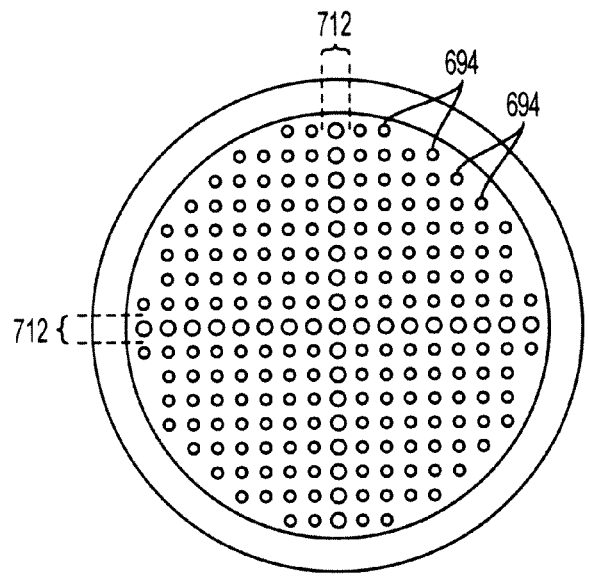
FIG. 13 is a top-down view of a manifold body shown in FIGS. 3 and 4 in accordance with an alternate embodiment of the present invention.
Figure 14:
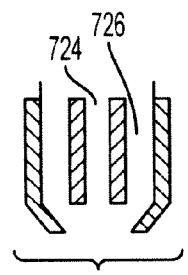
FIG. 14 is a detailed view of injection ports made in the manifold body shown in FIGS. 3, 4, 5 and 14 in accordance with an alternate embodiment of the present invention.

Referring to FIG. 12, in another embodiment, showerhead assembly 636 is substantially identical to showerhead assembly 90 of FIGS. 3, 4, and 5, except that body 612 extends from manifold 698 disposed opposite to baffle plate (not shown) and away therefrom. Body 612 serves the same function as body 112 and is fabricated in a similar manner. Body 612 can be chosen so as to or not to physically contact substrate surface 78 during processing. It should be understood that another embodiment of the showerhead does not require a physical barrier between the regions. Instead, as shown in FIG. 13, a plurality of apertures 712 may be present in which a curtain of inert gas is emitted to reduce, if not prevent, processing fluids introduced into one sector, e.g., quadrants 114-117, from propagating into another or an adjacent sector and thus effecting processing of the corresponding region on substrate 79. Another alternative embodiment is shown in FIG. 14, where each injection port of the showerhead may each have concentrically disposed passageways 724 and 726 so that processing fluids are kept separated until reaching the processing chamber. These passageways could also be adjacent instead of concentric or any other spatial and physical arrangements that maintain separation of the gases prior to entry in the processing chamber.

Figure 15A:
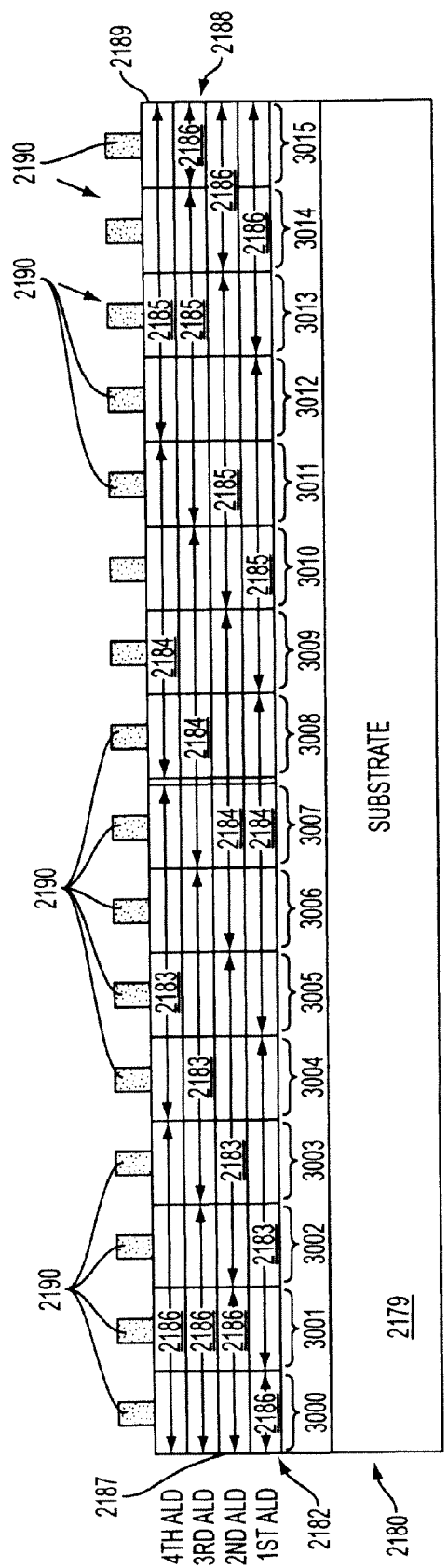
FIG. 15A shows a simplified cross sectional view of a substrate that has structures defined from combinatorial processing sequences for screening purposes in accordance with one embodiment of the invention.

Any of the chambers or systems described in FIG. 1, 9 or 10, or another chamber constructed according to or to implement the inventions described herein may include a motor 310 coupled to cause support shaft 49 and, therefore, support pedestal 48 to rotate about a central axis. A rotary vacuum seal such as a ferrofluidic seal can be used to maintain vacuum during rotation. It is understood that the showerhead in the chamber could also be rotated to create the same effect described below for the pedestal rotation. The rotating support pedestal 48 allows the creation of more regions on the substrate without adding more sectors on the showerhead (e.g., either through physical barriers, inert gas curtains, or other mechanisms). In addition, the rotation enables the easy creation of multi-layer deposition on the substrate. Specifically, the spatial orientation of regions on the substrate is varied with respect to the different portions of the volume of processing fluids, as shown in FIG. 15A, and described below in more detail. The rotation enables changing a relative angular position between the processing fluid volume and surface 78 multiple times, defining a sequence of angular rotations which represent a portion of the angular sector defined by the showerhead design.

Figure 16:
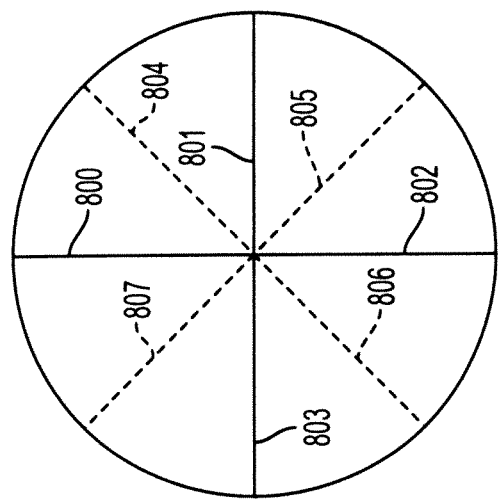
FIG. 16 is a top-down view of a substrate showing segmentation of regions thereof in accordance with an embodiment of the present invention.

For example, as shown in FIG. 16, first, second, third, and fourth regions of substrate 78 are exposed to the volume of processing fluids. The first region is bounded edges 800 and 801; the second region is bounded by edges 801 and 802; the third region is bounded by edges 802 and 803; and the fourth region is bounded by edges 800 and 803. Assume that each of the first, second, third and fourth regions are exposed to differing constituent components of the volume. This process produces a first layer of a first material in the first region, a first layer of a second material in the second region, a first layer of a third material in the third region and a first layer of a fourth material in the fourth region. It should be noted that one or a subset of the regions may include the gases necessary to deposit a material or prepare the region for deposition in a subsequent step (e.g., only the first region process may result in a layer being formed while the other regions are exposed to purge gas). In one example, at a second angular position, a fifth, sixth, seventh and eighth regions may be exposed to other constituent components of another volume of processing fluid. The rotation of the substrate holder and substrate in this example enables the creation of 8 regions on the substrate using the 4 sectors defined by the showerhead. The fifth region is bounded edges 804 and 805; the sixth region is bounded by edges 805 and 806; the seventh region is bounded by edges 806 and 807; and the eighth region is bounded by edges 804 and 807. Assume that each of the fifth, sixth, seventh and eighth regions are exposed to differing constituent components of the additional volume, which may or may not contain reactive gases, such as precursors or reagents. This process produces different layers and materials in each of the 8 sectors over time since each of the original quadrants is exposed to two different fluids in the second position.

In another embodiment, a first pair of opposing sectors can contain first (e.g., TMAH) and second reagents (e.g., $H_2O$) of an ALD deposition reaction bounded by purge sectors (e.g., Ar) in the remaining pair of opposing sectors. Substrate rotation is then used to deposit a substantially uniform ALD film across the entire substrate. In this embodiment, substrate rotation is used to sequence the gases that a particular region of the substrate sees as a function of time (e.g. TMAH+Ar purge+$H_2O$+Ar purge) as opposed to only through gas valving and flow. Flow through each sector is fixed and not diverted as a function of time. This methodology has benefits of uniformity and throughput and enables the creation of a full wafer process within the same combinatorial ALD chamber. Modulation of the rotation speed can be used to control the time per ALD cycle. A rotation speed of 60 revolutions per minute corresponds to an ALD cycle time of 1 second (Reagent 1+Purge+Reagent 2+Purge). Sixty seconds of substrate rotation during processing will equate to 60 ALD cycles.

FIG. 15A shows a simplified cross sectional view of substrate 2179 having material formed thereon from combinatorial processing sequences for screening purposes in accordance with one embodiment of the invention employing the rotation described in FIG. 16. Substrate 2179 has an electrically conductive layer 2180 disposed thereon that functions as an electrode. Layer 2180 may be deposited using any known deposition process, including physical vapor deposition (PVD). Deposited upon layer 2180 is a combinatorial layer 2182 that includes four regions 2183, 2184, 2185 and 2186, each of which has different constituent components (each of these regions can be created in a serial, semi-parallel, or full parallel manner in accordance with the invention (as described above). As an example, region 2183 may be formed from $Al_2O_3$, region 2184 is formed from $TiO_2$, region 2185 is formed $HfO_2$, and region 2186 is formed from $ZrO_2$.

Upon combinatorial layer 2182 is formed an additional combinatorial layer 2187 having regions 2183, 2184, 2185 and 2186. However, each of regions 2183, 2184, 2185 and 2186 in combinatorial layer 2187 is shifted with respect to regions 2183, 2184, 2185 and 2186 in combinatorial layer 2182. That is, region 2183 of combinatorial layer 2182 is in superimposition with sectors 3001-3004 of surface of conductive layer 2180; whereas, region 2183 of combinatorial layer 2187 is in superimposition with sectors 3002-3005 of surface of conductive layer 2180. This offset results from rotation of substrate 2179 with respect to showerhead 90 after formation of combinatorial layer 2182 and before formation of combinatorial layer 2187. Rotation of substrate 2179 may be undertaken between formation of each combinatorial layer, shown by the relative position of regions 2183, 2184, 2185 and 2186 of combinatorial layers 2188 and 2189. Formed upon combinatorial layer 2189 is a conductive feature 2190 that may be deposited by, for example by site isolated PVD, which may be processed in a conventional (blanket) fashion or in a combinatorial manner This provides a film stack having multiple regions (e.g., 16) with different materials even though the showerhead only has 4 sectors. Variation (e.g., process parameters, materials, thickness, etc.) of the conductive features 2190 using site isolated combinatorial PVD processing per sector creates additional variations in the final film stack.

Figure 15B:
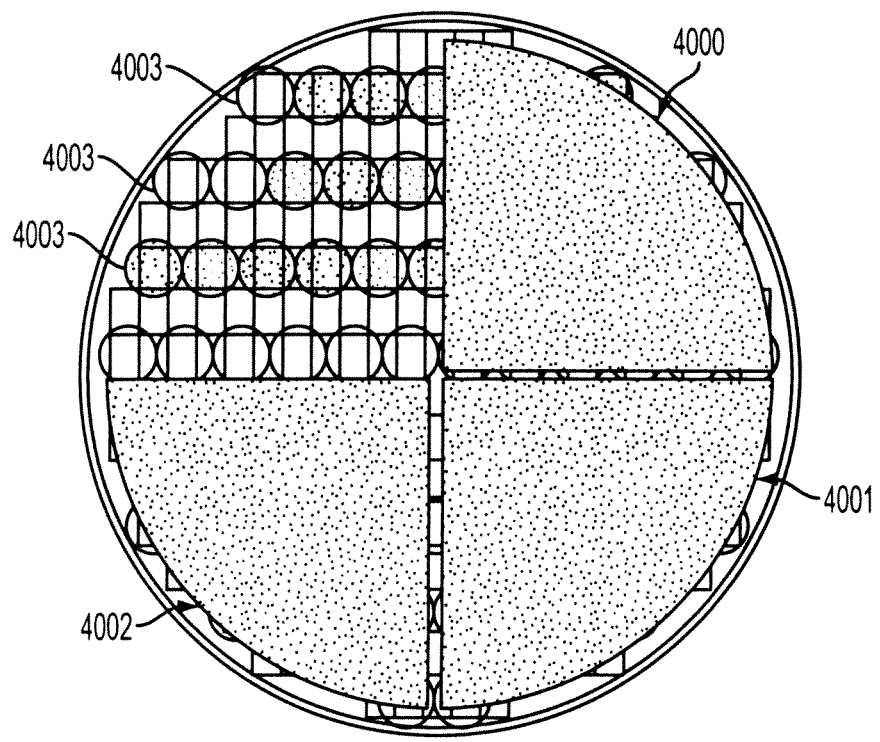
FIG. 15B is a top-down view of a substrate having material formed thereon in accordance with an alternate embodiment of the present invention.

With reference to FIG. 15B it is possible to combine different types of combinatorial processing. These different types may include, for example, site isolated regions processed by a PVD mask based technique and the isolated sector based system described herein. For example, combinatorial regions 4000, 4001, 4002 may be created with the system described herein on a substrate that already contains regions 4003 formed with PVD or other techniques, such as wet processing (including electroless deposition, electrochemical deposition, cleaning, monolayer formation, etc.). By combining these combinatorial techniques additional experiments can be conducted and the number of substrates used can be reduced while the amount of information gathered is increased.

It should be appreciated that FIGS. 15A and 15B illustrate the abundance of data provided from a single substrate under the combinatorial processing described herein. As illustrated above, segregated portions of a fluid volume having different constituent components flow over the surface of a substrate. These segregated portions concurrently expose corresponding segregated sectors of the substrate to a mixture of the constituent components that differ from constituent components to which an adjacent segregated sector is exposed. A layer is deposited over a segregated sector on the substrate, wherein the layer is different from a layer deposited on the adjacent segregated sector. The substrate may be rotated partially, i.e., some portion of 360 degrees of rotation and a stacked structure having different stacked layers may be built as illustrated in FIG. 15A. In addition, the features disposed on the stack may have differing geometries, e.g., the segregated sectors may be pie shaped (portions of a circle), while feature 2190 is circular.

Figure 17:
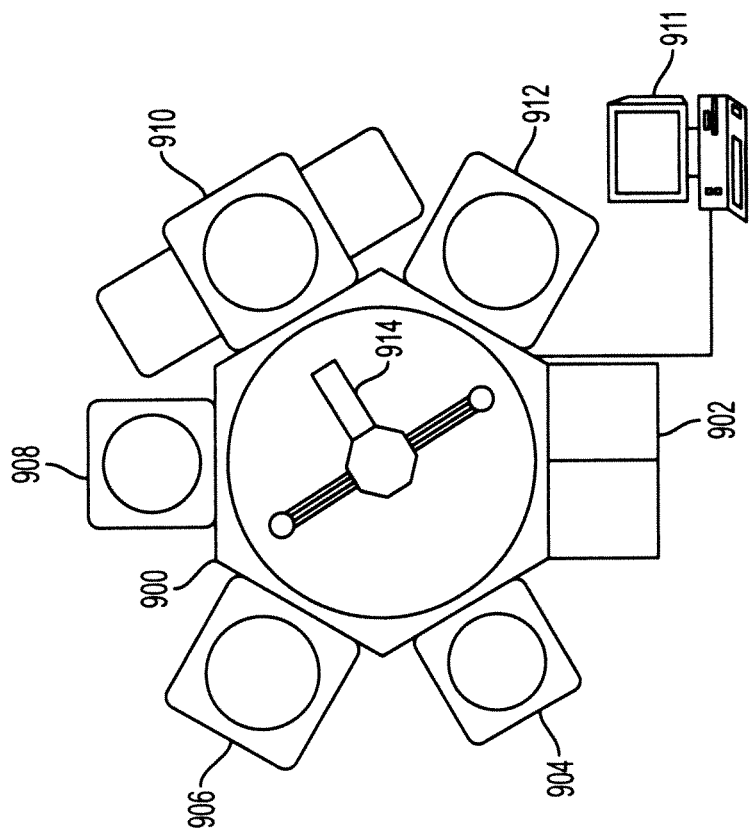
FIG. 17 is a simplified plan view of a cluster tool in which any of the processing systems shown in FIGS. 1, 9 and 10 may be included.

A simplified schematic diagram illustrating an integrated high productivity combinatorial (HPC) system in accordance with one embodiment of the invention is shown in FIG. 17. HPC system includes a frame 900 supporting a plurality of processing modules. It should be appreciated that frame 900 may be a unitary frame in accordance with one embodiment and may include multiple chambers for ease of maintaining the vacuum and/or the addition of more processing modules. In one embodiment, the environment within frame 900 is controlled. Load lock/factory interface 902 provides access into the plurality of modules of the HPC system. Robot 914 provides for the movement of substrates (and masks) between the modules and for the movement into and out of the load lock 902. Any known modules may be attached to the HPC System, including conventional processing modules and combinatorial processing modules that are necessary to support the experiments being run or a class of structures that one wishes to test using combinatorial techniques.

For example, Module 904 may be an orientation/degassing module in accordance with one embodiment. Module 906 may be a clean module, either plasma or non-plasma based, in accordance with one embodiment of the invention. Module 908 may be the substrate processing system described herein. Alternatively, Module 908 may contain a plurality of masks, also referred to as processing masks, for use in other modules of the HPC System. Module 910 includes a HPC physical vapor deposition (PVD) module in accordance with one embodiment of the invention, e.g., as described in U.S. application Ser. Nos. 11/672,478, and 11/672,473. In one embodiment, a centralized controller, i.e., computing device 911, may control the processes of the HPC system. With HPC system, a plurality of methods may be employed to deposit material upon a substrate employing combinatorial processes involving PVD, ALD, CVD and pre-post processing steps or other possible alternatives. Enabling the combinatorial processing in one cluster tool provides for better contaminant control, better environment control, more precise experimentation, testing of combinatorial process sequence integration, and better throughput when compared with shuttling the substrate between different tools or locations. For example, the processing shown in FIG. 15A can be conducted in one cluster tool enabling full wafer PVD, combinatorial ALD and combinatorial PVD. The processing illustrated with reference to FIG. 15B could be implemented in such a system having both combinatorial PVD and ALD or any other combination used to create structures on substrates.

Figure 18:
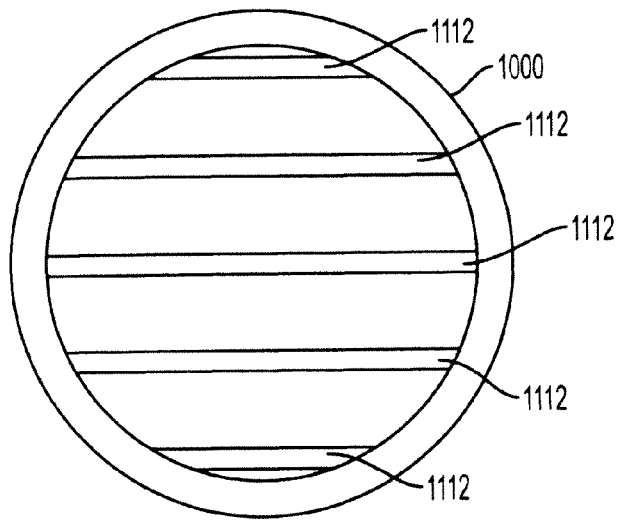
FIG. 18 is a bottom-up view of a fluid control mechanism in accordance with yet another embodiment of the present invention.
Figure 19:
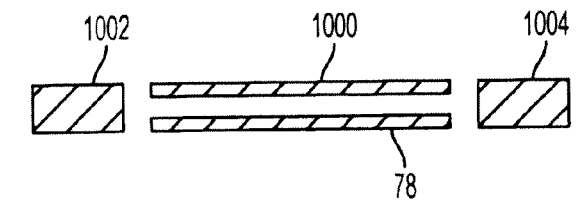
FIG. 19 is a simplified plan view of a system for depositing material on a substrate including the fluid control mechanism shown in FIG. 18.
Figure 20:
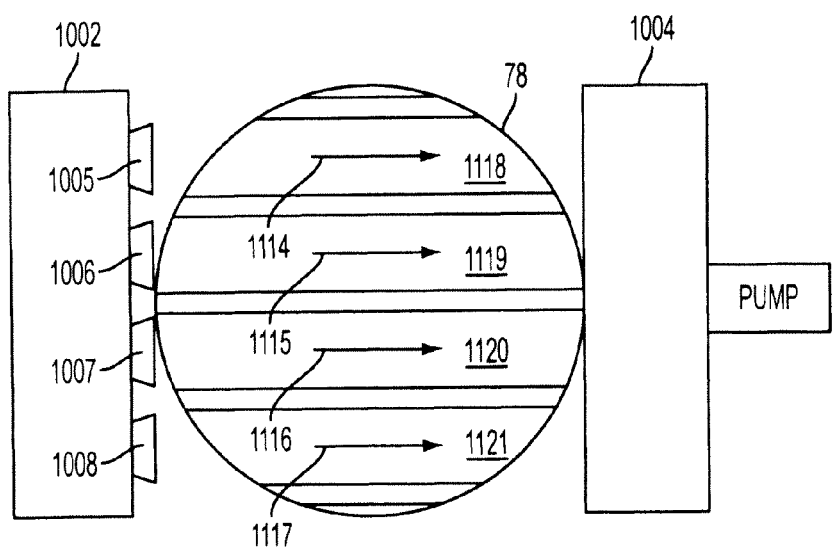
FIG. 20 is a top down view of the system shown in FIG. 19 with the fluid control mechanism removed.

Another embodiment of the present invention, as shown in FIGS. 18-20 may employ a vapor control device 1000 that is disposed proximate to substrate 78 with a vapor injection apparatus 1002 disposed opposite to a vapor extraction apparatus 1004. Vapor control device 1000 includes a plurality of spaced apart bodies 1112, which may be as described above with respect to bodies 112 or may be implemented through other separation techniques such as spacing or gas flow controls. During operation, vapor injection apparatus 1002 emits processing vapors from outlets 1005, 1006, 1007 and 1008. A vapor is emitted and moves across substrate 78 assisted by a vacuum produced by vapor extraction apparatus 1004. These flows 1114, 1115, 1116, 1117 move across regions 1118, 1119, 1120, 1121 of substrate 78. Conditions may be maintained so as to produce a layer of material (or pre/post processing) in regions 1118, 1119, 1120, 1121 or one region or a subset of regions as described above. The spacing shown in FIG. 19 is maintained at the appropriate distance to enable laminar flow of the vapors to assist in keeping the vapors separate and preventing inter-diffusion between the regions on the substrate.

Figure 23:
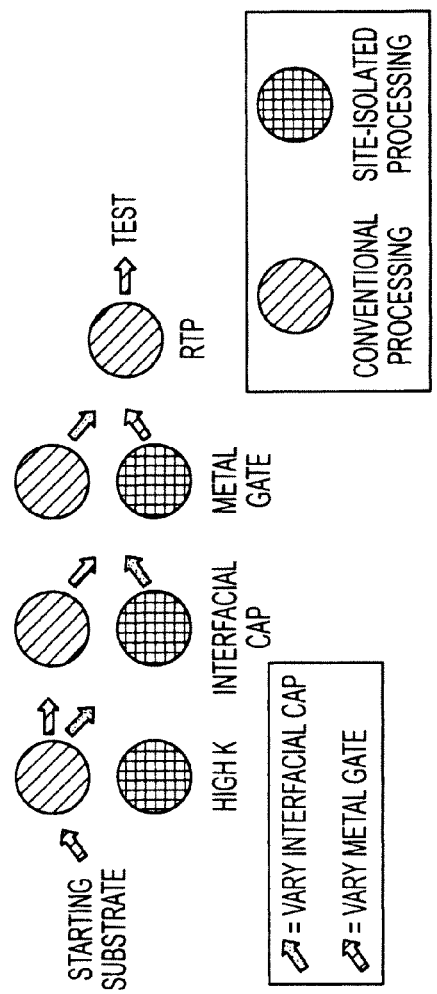
FIGS. 21-23 show the application of the screening process to a process sequence for a gate stack configuration in accordance with one embodiment of the invention.
Figure 21:
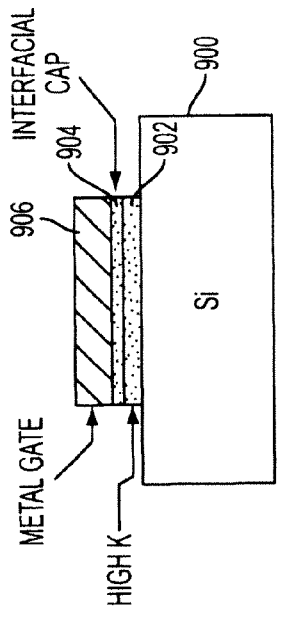
Figure 22:
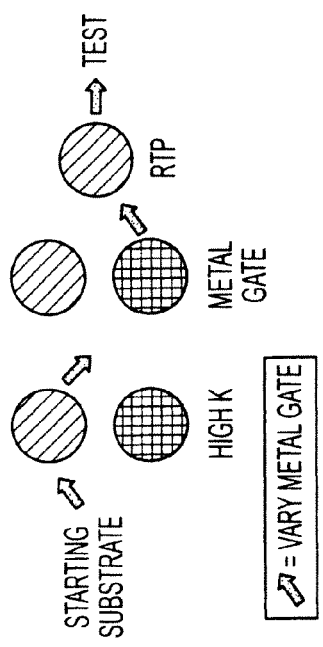

Referring to FIGS. 21, 22 and 23, the embodiments described herein may be applied to specific applications as noted below. For example, one of the embodiments may be directed to a process sequence for a gate stack configuration. As the use of high dielectric constant (referred to as High K) materials have become a viable alternative in the manufacture of semiconductor devices, especially for use as the gate oxide, there has been a great deal of interest in incorporating these materials into the process sequence for the manufacturing of semiconductor devices. However, in order to address mobility degradation and/or threshold voltage shifts that have been observed, an interfacial cap layer may be disposed between the metal gate electrode and the gate oxide to alleviate such degradation.

Referring to FIG. 23, silicon substrate 900 has High K gate oxide 902, interfacial cap 904 and gate 906 disposed thereon. One approach to incorporate the screening technique discussed above is to fix the High K material being disposed over the substrate in FIG. 21. In one embodiment, the High K material may be hafnium silicate or hafnium oxide. Fixing the High K component refers to performing this operation in a conventional full wafer manner (e.g., via full wafer, non-combinatorial atomic layer deposition). The process sequence for forming the metal gate is then varied combinatorially. Various metals can be used initially, such as tantalum silicon nitride, tantalum nitride, ruthenium, titanium nitride, rhenium, platinum, etc. The HPC system described in FIG. 17 can be used to effect such site isolated processing in one embodiment. The combinatorial vapor based system described herein may be used, for example, for processes including metal gate layers to adjust the effect work function of the gate electrode material. The resulting substrate is processed through a rapid thermal processing (RTP) step and the resulting structure of the metal over the insulator over the semiconductor substrate is then tested. Such tests include thermal stability, crystallization, delamination, capacitance-voltage, flat-band voltage, effective work function extrapolation, etc.

It may be determined that the use of a metal gate alone with the High K gate oxide is not compatible as defects are introduced into the structure as evidenced by testing results (e.g., effective work function shifts). Thus, a different process sequence is evaluated where an interfacial cap is disposed between the gate and the gate oxide. In one embodiment, the High K processing and the metal gate processing are fixed, while the interfacial cap processing is varied combinatorially. The substrate is annealed through RTP and the resulting structures are tested to identify optimum materials, unit processes and process sequences with an interfacial cap introduced between the High K material and the gate material. Examples of potential interfacial cap layers include lanthanum oxide, aluminum oxide, magnesium oxide, and scandium oxide. The combinatorial fluid system described herein may be used, for example, for processes including interfacial cap layers. The RTP processing may include rapid thermal anneal.

Figure 24:
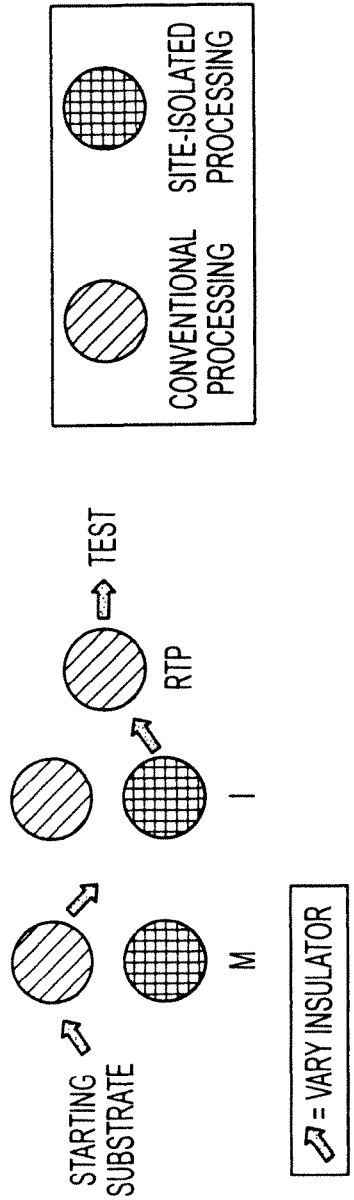
FIGS. 24-25 show a screening technique for evaluating a metal-insulator-metal (MIM) structure for a memory device in accordance with one embodiment of the invention.
Figure 25:
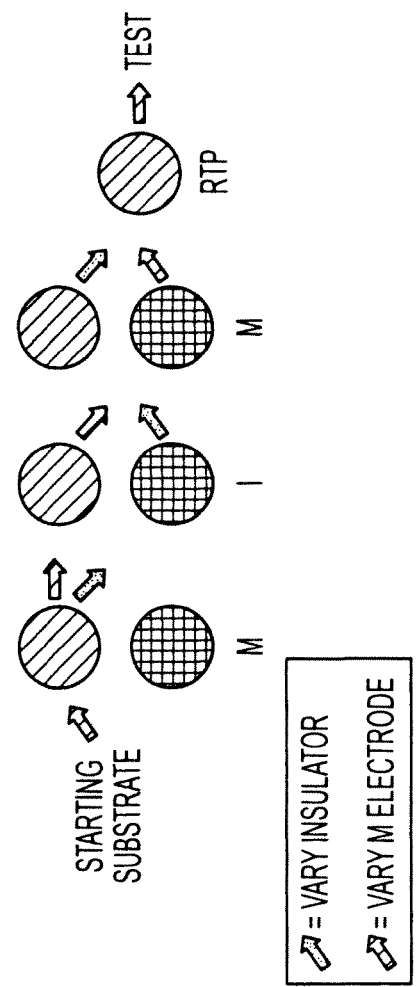

FIGS. 24 and 25 illustrate a screening technique for evaluating a metal-insulator-metal (MIM) structure for a memory device element in accordance with one embodiment of the invention. The memory device element can be, for example, a phase change, resistive change or other memory element, such as a DRAM memory element. The metal for this example may be a conductive element (e.g. W, Ta, Ni, Pt, Ir, Ru, etc.) or a conductive compound (e.g. TiN, TaN, WN, $RuO_2$, $IrO_2$, etc.) and forms the electrodes for the MIM structure. The insulator is a metal oxide, such as titanium oxide, niobium oxide, zirconium oxide, hafnium oxide, tantalum oxide, lanthanum oxide, silicon oxide, aluminum oxide, nickel oxide, a nano-laminate or nano-composite of any of the above oxides, and may include any other number of interfacial or other layers within the stack of memory materials. The insulator may be a binary metal oxide (BMO), a complex metal oxide (CMO), a nano-laminate, a doped or graded metal oxide, in this example. In the DRAM memory element example, it is desirable to achieve an optimum MIM stack exhibiting low leakage, low EOT, high effective dielectric constant, and good thermal stability.

An optimum process sequence for this example may be developed with the screening approach described herein. FIG. 24 illustrates a starting substrate and then a metal electrode M (e.g., TiN) is initially deposited uniformly over the substrate, i.e., through a conventional manufacturing process (e.g. physical vapor deposition or sputtering). Then, site isolated processing (e.g., using HPC system described in FIG. 17) is used to deposit (e.g. via combinatorial physical vapor deposition or combinatorial atomic layer deposition) the insulator layer in regions of the substrate having the metal electrode deposited thereon. As part of the insulator, interfacial layers may be deposited or multiple layers may be used to form the insulator (e.g., via ALD). Items for ALD processing that may be varied between the regions include the precursors, reagents, carrier gases, order of precursors, concentration of precursors/reagents, duration of precursor/reagent pulses, purge fluid species, purge fluid duration, partial pressures, total pressure, flow rates, film thickness, film composition, nano-laminates (e.g. stacking of different ALD film types), etc. The resulting substrate is post processed through RTP (optional step) and then tested. Thus, the substrate has a metal underlayer and the oxide is varied and then the substrate is annealed. The testing includes adhesion properties of the layers, resistance testing, dewetting, phase/crystallinity, and composition. Based on the testing a certain subset (e.g., combinations which show poor adhesion, dewetting, or have too low a film resistance, etc.) of the combinations are eliminated.

Then, with this reduced subset, the effect of putting another electrode on top of the M-I structure is evaluated as depicted by FIG. 25. Here, the bottom electrode and the insulator processes may be fixed (or varied as shown by alternative arrows) and the top electrode is varied. The resulting structures are annealed and tested as described above. The testing here may include current/voltage (I/V) testing for resistance switching (e.g., no switching, mono-stable switching, bi-stable switching, etc.) since the MIM stack has been constructed. As explained above, the testing is becoming more sophisticated as the screening process proceeds to define an optimal process sequence. The screening process determines an optimal metal oxide and corresponding unit processes, and then incorporates the optimal results to determine the process interaction with a top electrode as described with reference to FIG. 25.

In summary, the embodiments described above enable rapid and efficient screening of materials, unit processes, and process sequences for semiconductor manufacturing operations. Various layers may be deposited onto a surface of a substrate combinatorially within the same plane, on top of each other or some combination of the two, through the atomic layer deposition tool described herein. In one embodiment, the combinatorial process sequencing takes a substrate out of the conventional process flow, and introduces variation of structures or devices on a substrate in an unconventional manner, i.e., combinatorially. However, actual structures or devices are formed for analysis. That is, the layer, device element, trench, via, etc., are equivalent to a layer, device element, trench, via etc. defined through a conventional process. The embodiments described herein can be incorporated with any semiconductor manufacturing operation or other associated technology, such as process operations for flat panel displays, optoelectronics devices, data storage devices, magneto electronic devices, magneto optic devices, packaged devices, and the like.

Although the invention has been described in terms of specific embodiments, one skilled in the art will recognize that various modifications may be made that are within the scope of the present invention. For example, although four quadrants are shown, any number of quadrants may be provided, depending upon the number of differing process fluids employed to deposit material. Additionally, it is possible to provide the processing volume with a homogenous mixture of constituent components so that the processing chamber may function as a standard processing chamber for either ALD or CVD recipes. Therefore, the scope of the invention should not be limited to the foregoing description. Rather, the scope of the invention should be determined based upon the claims recited herein, including the full scope of equivalents thereof.

What is claimed is:

1. A chamber for combinatorially processing a substrate, comprising: a showerhead in flow communication with a fluid source, the showerhead having multiple inlets for receiving a plurality of fluid flows, each fluid flow having different constituent components, the showerhead further comprising a fluid separator for maintaining segregation of the plurality of fluid flows; a support pedestal; a peripheral flow channel surrounding the support pedestal; a pump channel connected to a vacuum source, wherein the dimensions of the peripheral flow channel are defined to provide a conductance of the plurality of fluid flows passing a periphery of the support pedestal such that a conductance of the plurality of fluid flows through the pump channel is at least 5 times greater than the conductance of the plurality of fluid flows through the peripheral flow channel, and thereby facilitating uniform axisymmetric flow of the plurality of fluid flows above the support pedestal.

2. The chamber of claim 1, further comprising: a fluid supply system coupled to the chamber, wherein the fluid supply system in cooperation with a pressure control system equalizes pressures of the plurality of fluid flows provided to the showerhead, such that the segregation of the fluid flows is maintained.

3. The system of claim 1 wherein an inlet to the vacuum source is located below the support pedestal.

4. The system of claim 1 wherein an inlet to the vacuum source is located proximate to an edge of the support pedestal.

5. The system of claim 1, wherein the fluid separator extends radially outward across a surface of the showerhead.

6. The system of claim 1, wherein the fluid separator is one of a wall within the showerhead, a wall extending into the chamber from the showerhead, concentric ports, or a set of radially aligned injection ports.

7. The system of claim 6, wherein the wall within the showerhead provides one of complete physical separation of sectors within the showerhead, or partial physical separation within the showerhead.

8. A semiconductor processing system, comprising: a fluid supply, the fluid supply comprising a plurality of constituent components, the constituent components comprising carrier fluids and precursors, the fluid supply stores and delivers different mixtures of the plurality of constituent components; and a chamber attached to a central frame about which multiple other chambers are oriented, the chamber comprising: a showerhead in flow communication with a fluid source, the showerhead having multiple inlets for receiving a plurality of fluid flows, each fluid flow having different constituent components, the showerhead further comprising a fluid separator for maintaining segregation of the plurality of fluid flows; a support pedestal; a peripheral flow channel surrounding the support pedestal; a pump channel connected to a vacuum source, wherein the dimensions of the peripheral flow channel are defined to provide a conductance of the plurality of fluid flows passing a periphery of the support pedestal such that a conductance of the plurality of fluid flows through the pump channel is at least 5 times greater than a conductance of the plurality of fluid flows through the peripheral flow channel, and thereby facilitating uniform axisymmetric flow of the plurality of fluid flows above the support pedestal.

9. The semiconductor processing system of claim 8, wherein one of the other chambers is a physical vapor deposition (PVD) module.

10. The semiconductor processing system of claim 8, wherein the chamber is in flow communication with a vacuum source, wherein an inlet to the vacuum source is separate from the showerhead.

11. The semiconductor processing system of claim 10 wherein a conductance of the inlet to the vacuum source is greater than a conductance of a peripheral flow channel defined around a periphery of the support pedestal.

12. The semiconductor processing system of claim 8, wherein the showerhead comprises a fluid separator extending radially outward across a surface of the showerhead.

13. The semiconductor processing system of claim 12, wherein the fluid separator is a set of injection ports.

* * * * *